United States Patent
Evans et al.

(10) Patent No.: US 7,171,528 B2
(45) Date of Patent: Jan. 30, 2007

(54) METHOD AND APPARATUS FOR GENERATING A WRITE MASK KEY

(75) Inventors: Marc Evans, San Jose, CA (US); Richard E. Perego, Thornton, CO (US); Frederick A. Ware, Los Altos Hills, CA (US)

(73) Assignee: Rambus Inc., Los Altos, CA (US)

( * ) Notice: Subject to any disclaimer, the term of this patent is extended or adjusted under 35 U.S.C. 154(b) by 155 days.

(21) Appl. No.: 10/896,167

(22) Filed: Jul. 21, 2004

(65) Prior Publication Data

US 2005/0015558 A1 Jan. 20, 2005

Related U.S. Application Data

(63) Continuation-in-part of application No. 10/386,236, filed on Mar. 11, 2003, now Pat. No. 6,826,663, and a continuation-in-part of application No. 10/385,908, filed on Mar. 11, 2003.

(60) Provisional application No. 60/439,666, filed on Jan. 13, 2003.

(51) Int. Cl.
*G06F 12/20* (2006.01)

(52) U.S. Cl. ................... 711/156; 711/153; 711/170; 365/120

(58) Field of Classification Search ............... None
See application file for complete search history.

(56) References Cited

U.S. PATENT DOCUMENTS 4,543,644 A   9/1985   Kozima et al.

4,745,577 A   5/1988   Ogawa et al.
5,216,633 A   6/1993   Weon et al.
5,243,703 A   9/1993   Farmwald et al.
5,499,385 A   3/1996   Farmwald et al.

(Continued)

FOREIGN PATENT DOCUMENTS

| EP | 0883066 | 9/1998 |
|----|---------|--------|
| EP | 0604309 | 3/2006 |
| WO | WO0215020 | 2/2002 |

OTHER PUBLICATIONS

WARE, "16/18Mbit (2Mx8/9) & 64/72Mbit (8Mx8/9) Concurrent RDRAM", Rambus Inc. Data Sheet, Jul. 1996.
8/9-Mbit (1M x 8/9) and 16/18-Mbit (2M x 8/9) RDRAM, Rambus Inc. Data Sheet, Mar. 1, 1996.

(Continued)

*Primary Examiner*—Christian P. Chace
(74) *Attorney, Agent, or Firm*—Vierra Magen Marcus & DeNiro LLP

(57) ABSTRACT

A method and apparatus provides a mask key that is used instead of mask data. In an embodiment of the present invention, a write mask key is generated by a memory controller and transferred to a memory device that uses the write mask key to determine whether to write a data value to a storage array. A plurality of decoders, an OR logic gate tree and a binary propagation tree is used to provide the write mask key that reduces latency while using the approximate same circuit area and allows for the use of standard software tools in an embodiment of the present invention. A plurality of $\log_2$ decoders is coupled to a plurality of OR logic gates in the OR logic gate tree.

32 Claims, 18 Drawing Sheets

U.S. PATENT DOCUMENTS

| | | |
|---|---|---|
| 5,715,407 A | 2/1998 | Barth et al. |
| 5,764,963 A | 6/1998 | Ware et al. |
| 5,765,020 A | 6/1998 | Barth et al. |
| 5,806,070 A | 9/1998 | Norman et al. |
| 5,872,996 A | 2/1999 | Barth et al. |
| 5,896,545 A | 4/1999 | Barth et al. |
| 6,122,189 A | 9/2000 | Batra |
| 6,128,696 A | 10/2000 | Farmwald et al. |
| 6,151,239 A | 11/2000 | Batra |
| 6,266,737 B1 | 7/2001 | Ware et al. |
| 6,304,930 B1 | 10/2001 | Yamauchi |
| 6,347,354 B1 | 2/2002 | Abhyankar et al. |
| 6,401,167 B1 | 6/2002 | Barth et al. |
| 6,578,126 B1 | 6/2003 | MacLellan et al. |
| 6,757,789 B2 | 6/2004 | Abhyankar et al. |
| 2003/0159039 A1 | 8/2003 | Gilbert et al. |
| 2003/0179605 A1 | 9/2003 | Riesenman et al. |
| 2003/0182519 A1 | 9/2003 | Riesenman et al. |
| 2004/0093471 A1 | 5/2004 | Riesenman et al. |

OTHER PUBLICATIONS

"Intel 430TX PCISET: 824395TX System Controller (MTXC)", Intel Corporation, Feb. 1997.

"Intel 815 Chipset Family: 82815 Graphics and Memory Controller Hub (GMCH)", Intel Datasheet, Jun. 2000.

"AMD-640 System Controller Data Sheet", AMD, Jun. 1997.

"AMD-751 System Controller Data Sheet", AMD, Mar. 2000.

"AMD-762 System Controller Data Sheet", AMD, Dec. 2001.

"ASSP for Graphics Control Graphics Display Controller MB86290A", Fujitsu Semiconductor Data Sheet, Fujitsu Limited, 2000.

"FCRAM I IP Core", Lattice Semiconductor Corporation, 2004.

"Direct Rambus Technology Overview", Rambus Inc., Oct. 1997.

Barth et al., "A Logical Overview of Direct Rambus Architecture", Rambus Inc., Mar. 1998.

Ware, "Direct RAC Data Sheet", Rambus Inc., Jul. 2000.

Ware, "Direct RDRAM 64/72-Mbit (256Kx16/18/x16d0", Rambus Inc., Jun. 1998.

"Virtex Synthesizable 1.6 Gbytes/s DDR SDRAM Controller", XILINX, XAPP200, Version 1.2, Oct. 12, 1999.

"Virtex Synthesizable High Performance SDRAM Controller", XILINX, XAPP134, Version 2.1, Sep. 10, 1999.

European Search Report for UK Patent Application No. 0514229.4, Jul. 2, 2006.

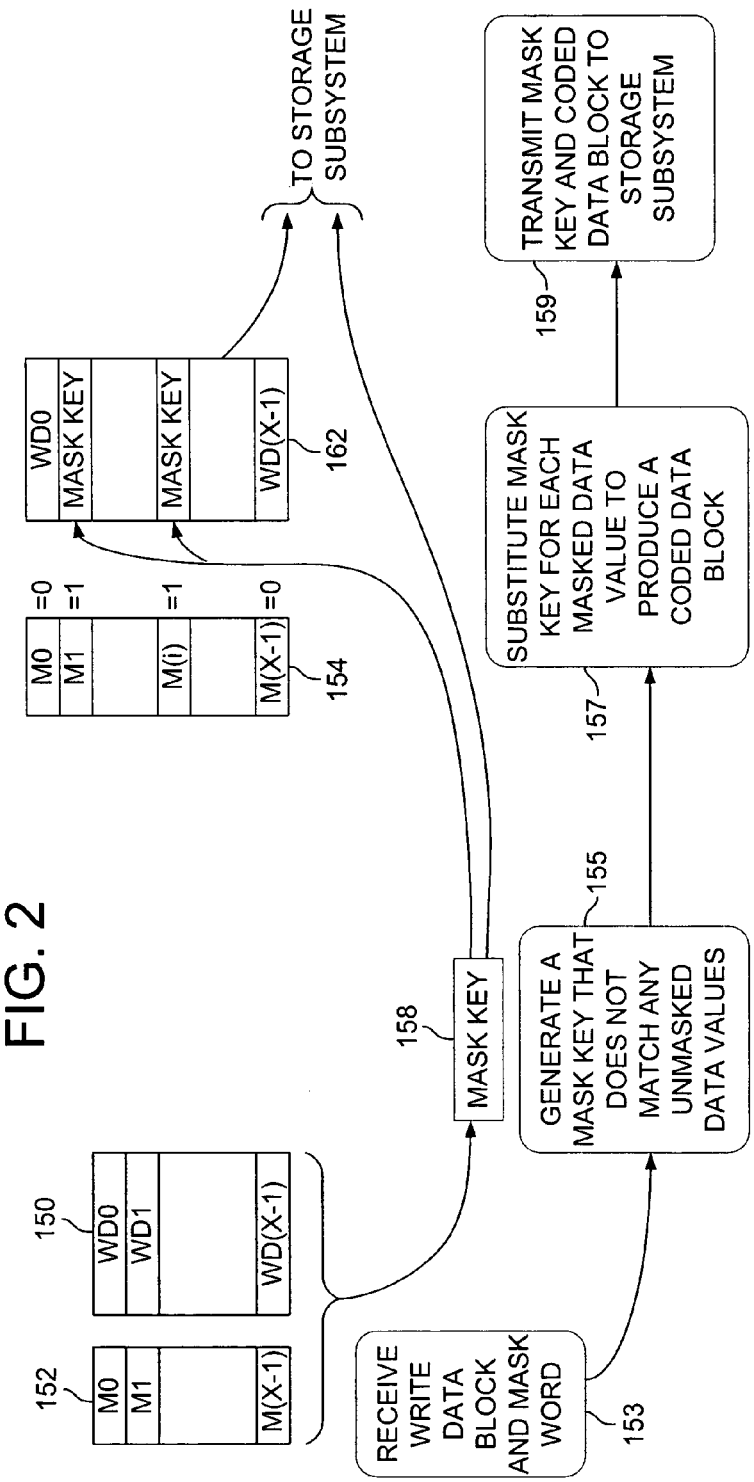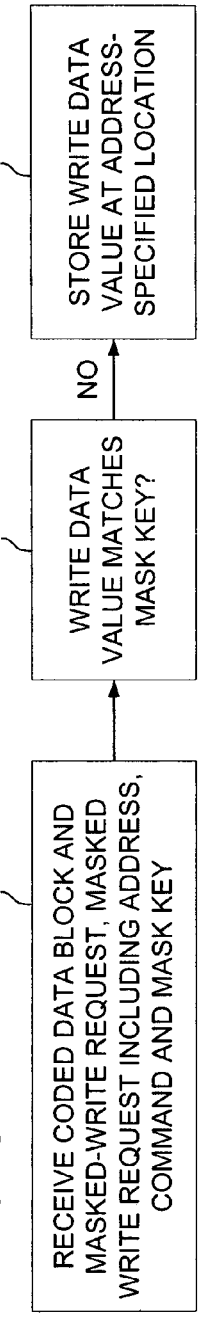

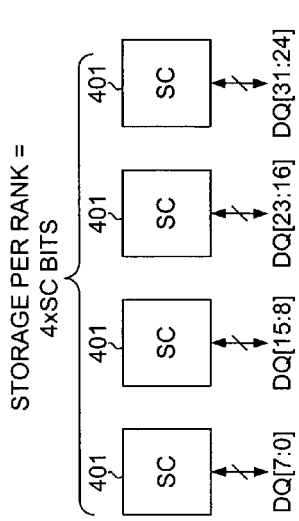
FIG. 10
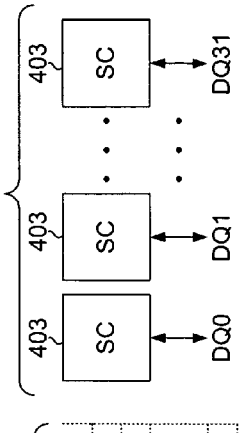
FIG. 11
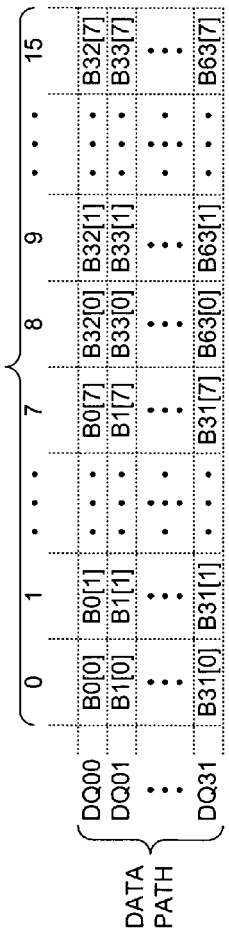
FIG. 12
FIG. 13

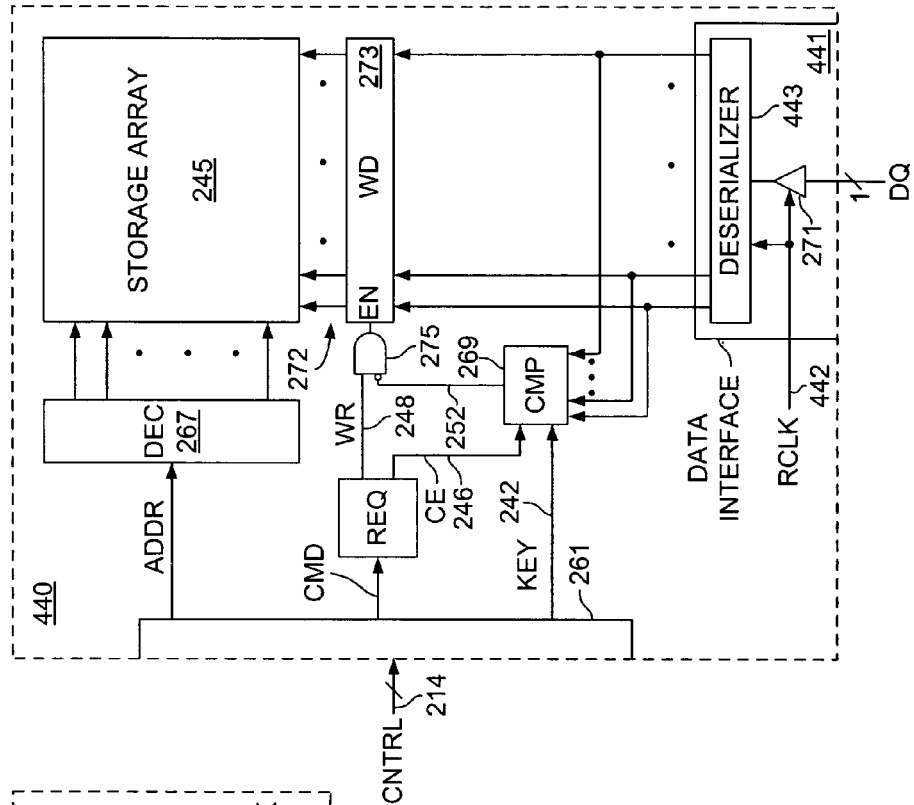
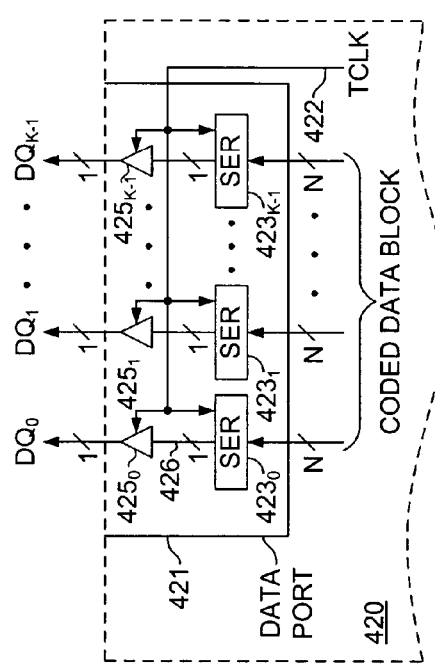
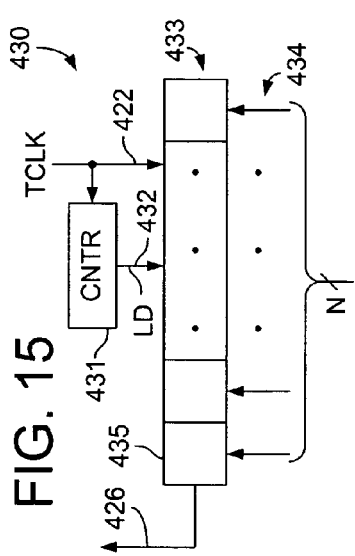

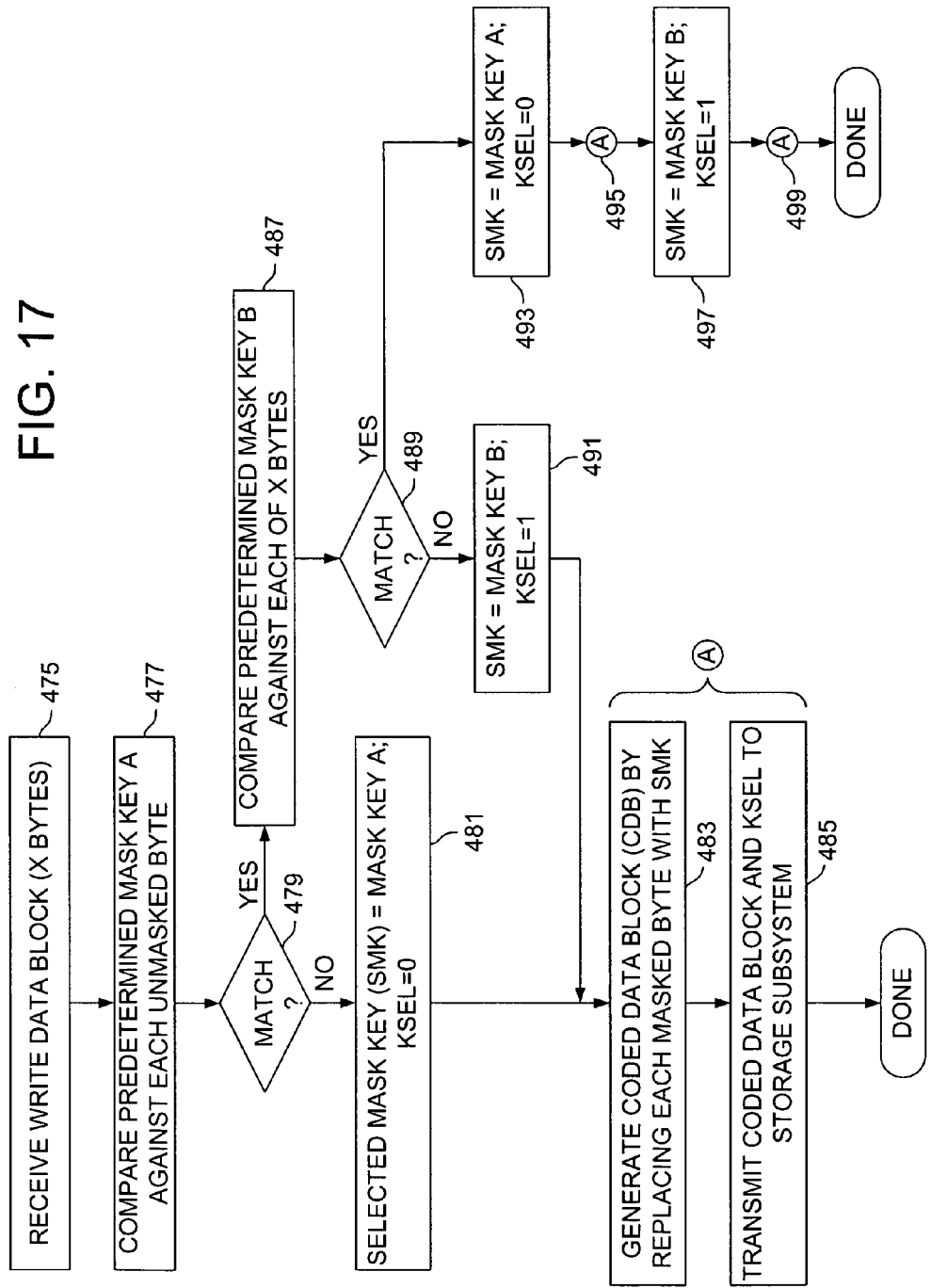

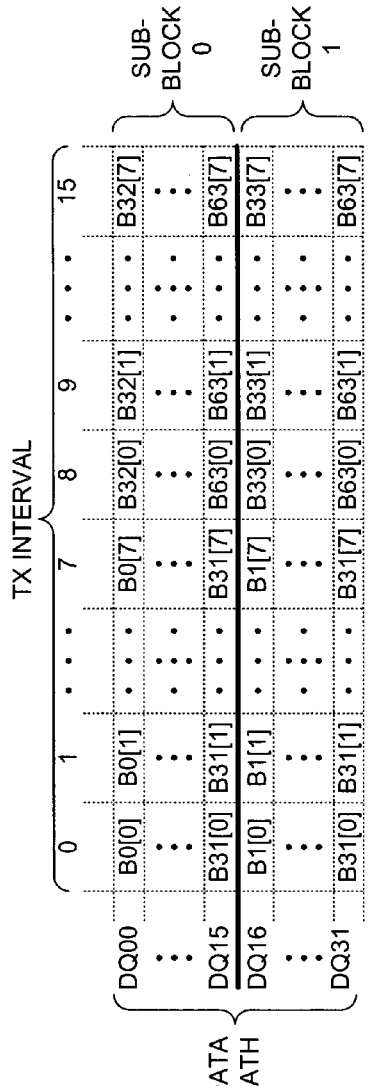
FIG. 24
FIG. 25
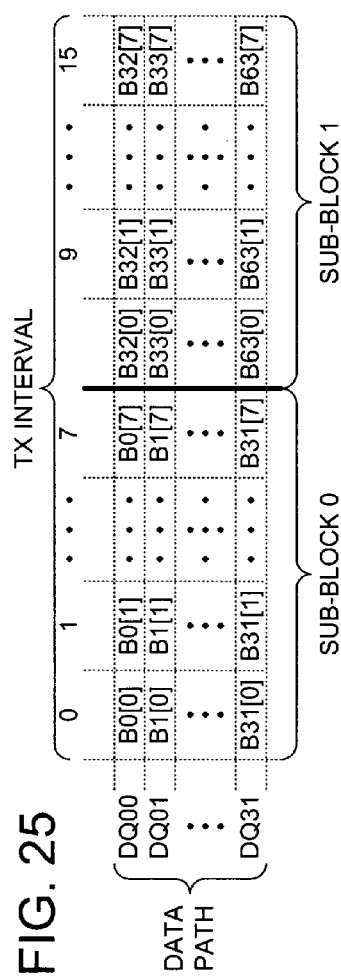
| KSEL[1:0] | COMMAND |
|---|---|
| 00 | UNMASKED WRITE |
| 01 | MASKED WRITE WITH KEY 0 |
| 10 | MASKED WRITE WITH KEY 1 |
| 11 | MASKED WRITE WITH KEY 2 |
FIG. 26

METHOD AND APPARATUS FOR GENERATING A WRITE MASK KEY

This application is a continuation-in-part of U.S. Utility application Ser. No. 10/386,236 filed Mar. 11, 2003 entitled "Coded Write Masking" and U.S. Utility application Ser. No. 10/385,908 filed Mar. 11, 2003 entitled "Memory System and Device with Serialized Data Transfer"; which applications each claim priority to U.S. Provisional Application No. 60/439,666 filed Jan. 13, 2003 entitled "Coded Write Masking" that is hereby incorporated by reference in its entirety.

FIELD OF THE INVENTION

The present invention relates generally to generating a mask key and more particularly to data transfer and storage technology.

BACKGROUND OF THE RELATED ART

Read and write accesses in modern memory systems are typically transacted through transfers of multi-byte blocks of data. When less than a full data block is to be read from the memory system, the address of a data block that encompasses the desired data is provided to the memory system and the full data block is read. Generally speaking, there is no penalty to reading more data than needed. By contrast, when writing a value smaller than a full data block, it is important that the stored data block remain unchanged except for the value written. This is typically accomplished through one of two types of specialized write operations: merged write operations or masked write operations.

In a merged write operation (sometimes called a read-merge-write operation or read-modify-write operation), a memory controller reads the data block to be updated, merges the write data value into the data block at the appropriate offset, then writes the updated data block back to storage. Because two memory accesses are required (read and write), merged write operations substantially reduce peak bandwidth of the memory system and therefore are typically not used in high performance systems.

In a masked write operation, the memory controller issues mask signals to the storage subsystem to qualify each data value within the data block as being masked or unmasked. The storage subsystem responds by storing only unmasked data values. For legacy purposes, the granularity of data masking typically extends to byte (i.e., eight-bit) granularity. Data masking with eight bit or byte granularity is sometimes referred to as byte-masking. While byte-masking has the disadvantage of requiring additional hardware in the storage subsystem (i.e., to detect and respond to the mask signals), the double-access performance penalty associated with merged write operations is avoided.

FIG. 1 illustrates a prior art byte-masking memory system 100 having a memory controller 101 and a storage subsystem 103. The memory controller 101 includes a host interface 105 to receive access requests (REQ), data blocks (DATA) and mask information (MASK) from an access requester, and a memory interface 107 to issue corresponding requests, data blocks and mask information to the storage subsystem. In a masked write operation, a 64-byte write data block (512 bits) is received via the host interface 105 along with a 64-bit mask word and a masked-write request. Each bit of the mask word corresponds to a respective byte of the write data block and, if set, indicates that the byte is a masked byte not to be stored within the storage subsystem. The memory controller 101 responds to the masked-write request by issuing a masked-write instruction to the storage subsystem 103 via a request path 102, and by transferring the write data block and mask word to the storage subsystem via a data path 104. The data path includes 32 data lines 108 for parallel transfer of four data bytes and four mask lines 106 for transferring four corresponding mask bits. Consequently, the complete write data block and mask word are transferred to the storage subsystem in a sequence of sixteen data transfers, each transfer including four bytes of the write data block and four bits of the mask word.

The storage subsystem 103 is formed by a number of discrete memory devices, $MEM_{R1}$, each having a request interface and a data interface. The request interface of each memory device is coupled to the request path 102 to receive the masked-write instruction (including an address value), and the data interface of each memory device is coupled to a respective 9-bit slice of the data path to receive a data byte and corresponding mask bit in each of the sixteen data transfers. For each data transfer, each of the memory devices stores the data byte at a location indicated by the address value (offset according to which of the sixteen data transfers is being acted on) only if the mask bit is not set.

One drawback to the prior-art memory system 100 is that a substantial portion of the data path 104, one line out of every nine, is dedicated to mask signal transfer. Thus, more than 10% of the data path bandwidth is reserved to support byte masking. This bandwidth penalty becomes worse as the device width (i.e., the width of the memory device data interface excluding the mask input) is reduced. For example, if the device width is reduced from eight bits to four bits, then 20% of the data path bandwidth (one out every five signal lines) is reserved for byte masking. Thus, in addition to imposing a substantial bandwidth penalty, the byte masking technique used in the prior-art memory system 100 effectively constrains the device widths of the memory devices within the storage subsystem 103 to be at least eight bits. This device width constraint translates directly into a memory size constraint for a given generation of memory devices and data path width. For example, assuming storage capacity of 512 megabits (Mb) for a given generation of memory devices and a data path width of 32 lines (excluding mask lines), the total size of memory that is coupled in point-to-point fashion to the memory controller is 512 Mb*(32/8)=2 Gigabits (Gb). While an additional group of memory devices may be coupled to the data path 104, as shown in dashed outline in FIG. 1 by devices $MEM_{R2}$, the additional signal line connections effectively transform the data path 104 into a multi-drop bus. Multi-drop bus arrangements have different, and sometimes significantly less desirable, signaling characteristics than point-to-point arrangements.

BRIEF DESCRIPTION OF THE DRAWING

The present invention is illustrated by way of example, and not by way of limitation, in the figures of the accompanying drawings and in which like reference numerals refer to similar elements and in which:

FIG. 2 illustrates a method of operation within a memory controller according to an embodiment of the invention;

FIG. 3 illustrates a method of operation within a storage subsystem according to an embodiment of the invention;

FIG. 10 illustrates an exemplary timing diagram for the transfer of byte-sized write data values over a data path between the memory controller and storage subsystem of FIG. 4;

FIG. 11 illustrates the storage capacity that can be achieved in a single-rank of memory devices using the data transfer scheme of FIG. 10;

FIG. 12 illustrates a data transfer scheme in an alternative embodiment of the invention that enables the per-rank storage capacity of the storage subsystem to be substantially increased;

FIG. 13 illustrates the storage capacity that can be achieved in a single-rank of memory devices using the data transfer scheme of FIG. 12;

FIG. 14 illustrates the data port of a serial-transfer memory controller according to an embodiment of the invention;

FIG. 15 illustrates an exemplary embodiment of a serializing circuit that may be used within the data port of FIG. 14;

FIG. 16 illustrates a serial-transfer memory device according to an embodiment of the invention;

FIG. 17 illustrates the operation of a key selecting memory controller according to an embodiment of the invention;

FIG. 24 illustrates an exemplary spatial partitioning of a write data block into two sub-blocks;

FIG. 25 illustrates an exemplary temporal partitioning of a write data block into two sub-blocks;

FIG. 26 illustrates an exemplary encoding of a key selector that may be used within a key-selecting memory system of the present invention;

DETAILED DESCRIPTION

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal.

Figure 1:
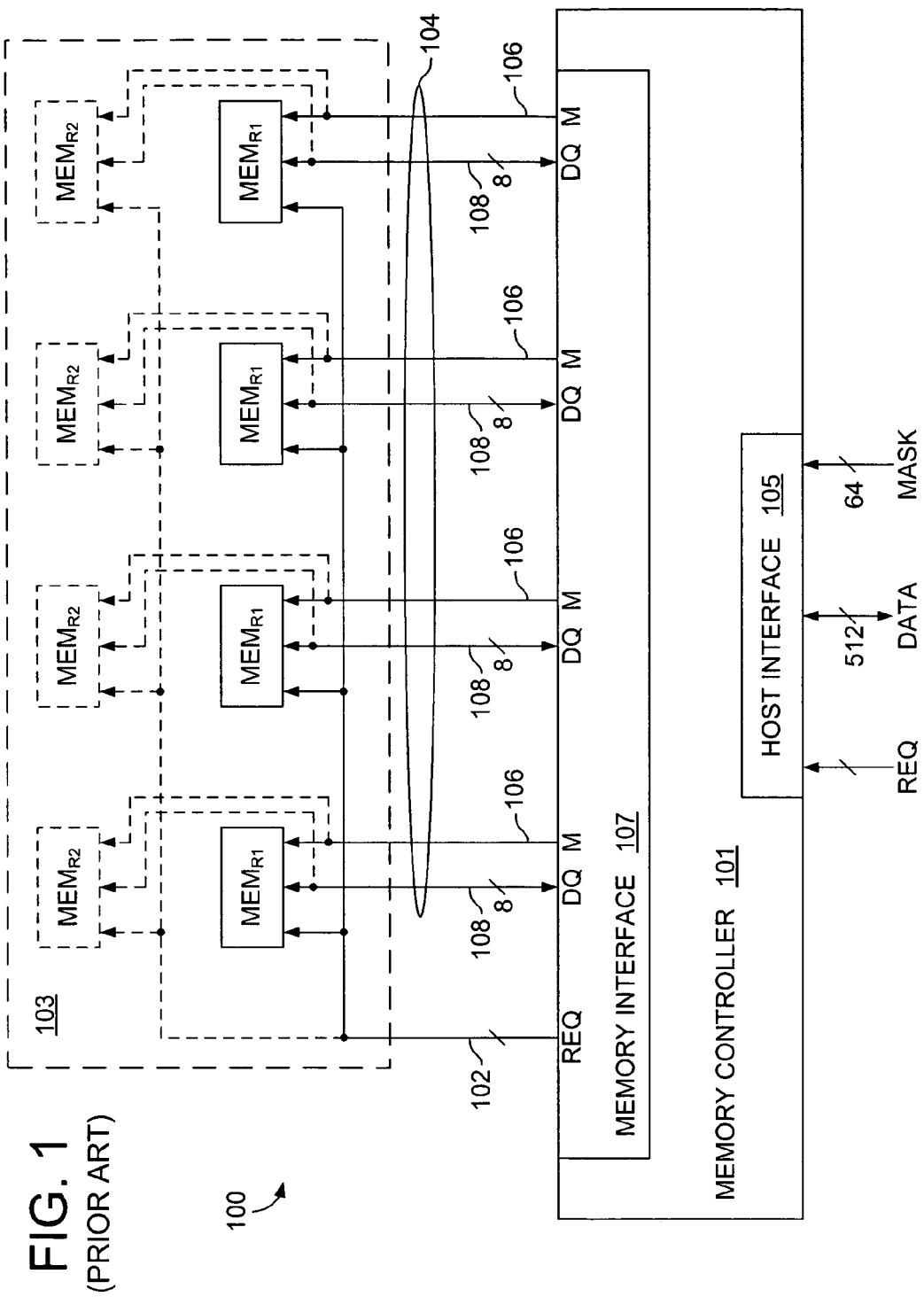
FIG. 1 illustrates a prior art byte-masking memory system.

A write-masking memory system in which a key value is substituted for masked data values within an incoming write data block is disclosed herein in various embodiments. In one embodiment, the key value is dynamically generated by the memory system, then substituted for each masked data value to produce a coded data block. A key generator including a plurality of decoders and a binary propagation tree provides the key value (also described as a mask key or write mask key). A key generator that includes a plurality of decoders and binary propagation tree provides many advantages over a key generator having binary adders. A key generator including decoders and a binary propagation tree uses less or approximately the same circuit area, has less latency and allows for the use of standard hardware design tools. In particular, a level of pipelining may be increased to reduce cycle times at some incremental area. The coded data block and key value are each output to a storage subsystem that includes one or more discrete memory devices. The discrete memory devices compare the key value with the constituent write data values of the coded data block and store only those write data values determined not to match the key value. Because the key value is used to identify masked data values, transmission of dedicated mask signals (i.e., mask signal per write data value as in the memory system of FIG. 1) is unnecessary, making the full data path between memory controller and storage subsystem available for write data transfer and achieving a substantial bandwidth savings over the prior art memory system of FIG. 1.

In an alternative embodiment of the invention, the memory controller selects a key value from a table of predetermined values, then passes a selector value to the storage subsystem to indicate which of the predetermined values was selected. Each of the discrete memory devices within the storage subsystem includes the table of predetermined values and uses the selector value to select the selector-specified key value. The selected key value is then used to identify masked data values so that they are excluded from storage. Because the selector value may be significantly smaller than a key value, additional bandwidth savings are achieved.

Although the invention is described below primarily in reference to a memory system embodiment having a memory controller and storage subsystem, the techniques and structures described may be applied elsewhere within a processing system. For example, a processor or other memory requestor may perform the key value substitution in a write data block and transfer the resulting coded data block and key value to a memory controller. The memory controller may then forward the key value and coded data block to the storage subsystem to complete the masked write operation.

Memory System with Coded Write Masking

FIG. 2 illustrates a method of operation within a memory controller according to an embodiment of the invention. At 153, the memory controller receives a write data block 150 containing X write data values, WD0-WD(X−1), and a corresponding mask word 152 containing X mask values, M0-M(X−1), each mask value corresponding to a respective one of the write data values. The write data values may be any size (e.g., 8-bit, 16-bit, 32-bit, etc.) but, at least in the embodiment of FIG. 2, include a sufficient number of constituent bits to ensure that there are at least X possible bit patterns. That is, if the write data value size is N bits, then N is large enough to ensure that $2^N \geq X$. This arrangement ensures that there is at least one pattern of N bits that will not match any of the X−1 possible bit patterns of the unmasked data values in a masked-write operation (i.e., because at least one of the X write data values in the write data block is masked). For the remainder of this description, the mask values are assumed to be single-bit values and are referred to as mask bits, though multi-bit mask values may alternatively be used.

At 155, the memory controller generates a key value, referred to herein as mask key 158, having N constituent bits arranged in a pattern that does not match any of the unmasked data values. At 157, the mask key is substituted for each masked data value in the write data block to produce a coded data block 162. For example, as shown at 154, bits M1 and M(i) of the mask word are set (e.g., to a logic '1' value), indicating that the corresponding write data values are masked data values. Accordingly, the mask key 158 is substituted for the masked data values to generate the coded data block 162. At 159, the coded data block and mask key are transmitted to the storage subsystem.

FIG. 3 illustrates a method of operation within the storage subsystem referred to in FIG. 2 according to an embodiment of the invention. At 175, the storage subsystem receives the coded data block referred to in FIG. 2, and a masked-write request that includes a masked-write command, the mask key referred to in FIG. 2, and the address of a target storage location within the storage subsystem (e.g., starting address of the range of storage locations to be written). As discussed below, the command, mask key and/or address may be multiplexed onto a set of request lines or may be received via respective sets of signal lines. The coded data block may be received before, after or concurrently with the masked-write request or any portion thereof.

Figure 4:
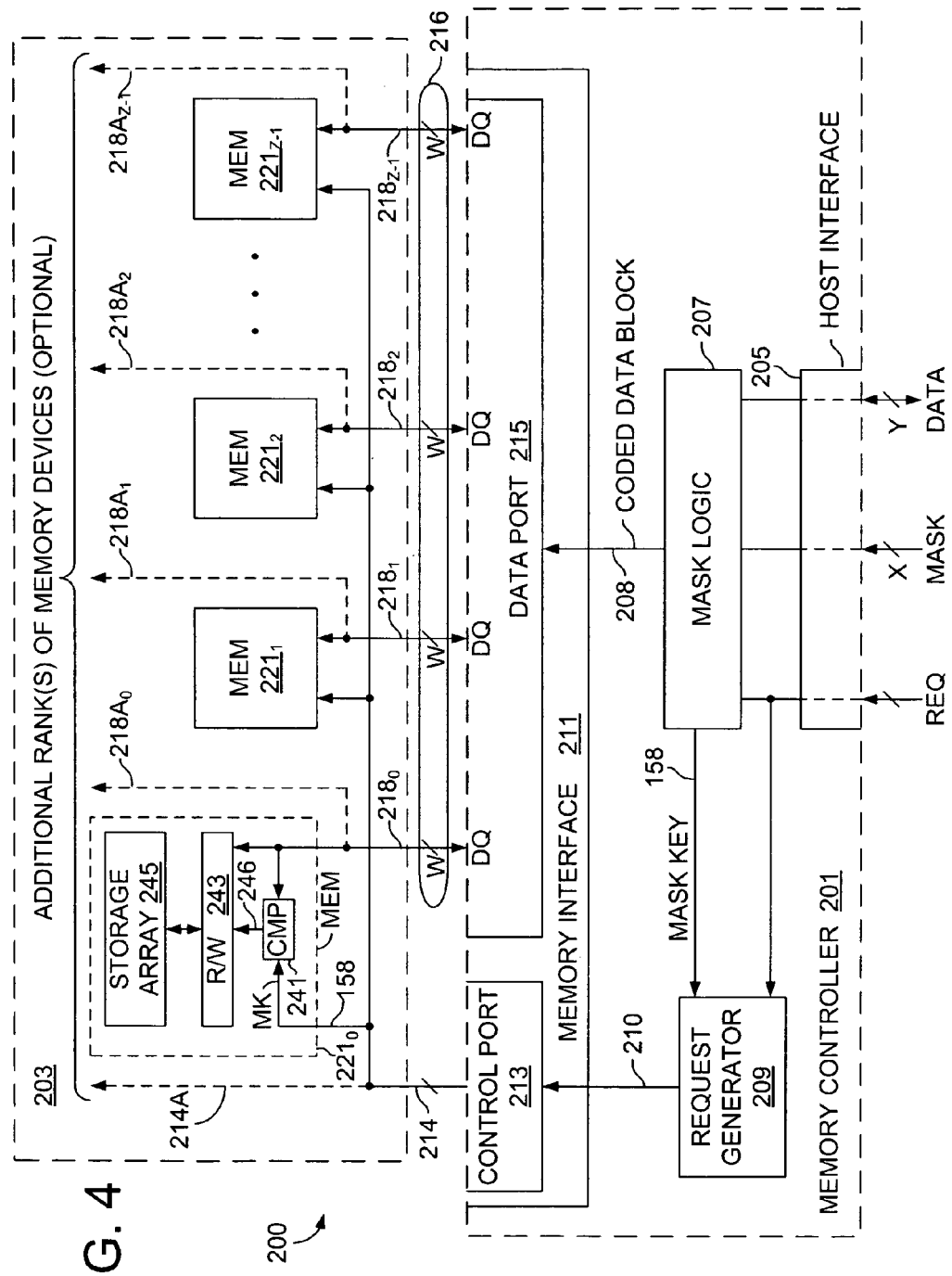
FIG. 4 illustrates a memory system according to an embodiment of the invention.

At 177, each write data value within the coded data block is compared with the mask key. If a given write data value does not match the mask key, then at 179 the write data value is stored within the storage subsystem at the address specified in the masked-write request. If the write data value matches the mask key, the write data value is excluded from storage within the storage subsystem, thereby achieving the selective storage function of the masked-write operation. FIG. 4 illustrates a memory system 200 according to an embodiment of the invention. The memory system 200 includes a memory controller 201 and storage subsystem 203 coupled to one another via a control path 214 and a data path 216. The memory controller 201 includes a host interface 205, memory interface, mask logic circuit 207 and request generator 209.

The host interface 205 is coupled to receive access requests, data and mask information from one or more access requestors (e.g., a processor, application specific integrated circuit (ASIC), DMA controller, or other requester). When an access request specifies a masked-write operation, a write data block (DATA) having Y constituent bits and a mask word (MASK) having X constituent bits is received in the memory controller via the host interface. Thus, each mask bit corresponds to a respective group of Y/X bits of the write data block (i.e., mask granularity=Y/X). Each such maskable group of Y/X bits is referred to herein as a write data value, and the write data block is referred to as having X constituent write data values. As an example, if Y=512 (512-bit write data block) and X=64 (64-bit mask word), then the write data block includes 64 byte-sized write data values. As another example, if Y=512 and X=16, then the write data block is deemed to include sixteen 32-bit write data values. Numerous other values of Y and X may be used.

Note that the data portion of the host interface is depicted as being coupled to Y data lines for purposes of example only. The data portion of the host interface may alternatively be coupled to more or fewer than Y data lines and the Y-bit write data block received in a sequence of write data transfers. Similarly, the mask portion of the host interface may be coupled to more or fewer than X mask signal lines and the X-bit mask word received in a sequence of mask transfers.

The masked-write request, write data block and mask word are supplied to the mask logic circuit 207 which, in turn, generates a mask key 158 and coded data block 208. The coded data block 208 is supplied to a data port 215 within the memory interface, and the mask key 158 is supplied to the request generator 209. The request generator 209 also receives the masked-write request from the host interface and, in response, outputs corresponding control information 210 to a control port 213 within the memory interface 211, the control information including the mask key 158 and a write address indicated by the masked-write request. The control port includes a bank of output drivers (not specifically shown in FIG. 4) to output the control information 210 to the storage subsystem via the control path 214. The data port similarly includes a bank of output drivers to output the coded data block 208 to the storage subsystem via the data path.

The storage subsystem 203 includes a group of Z discrete memory devices $221_0$–$221_{Z-1}$, each coupled to the control path 214 and to a respective portion of the data path 216 (i.e., as indicated by $218_0$–$218_{Z-1}$). By this arrangement, each of the memory devices 221 receives the control information 210 and a respective portion of the coded data block 208 from the memory controller 201. The number of data lines, W, coupled to each of the memory devices 221 is an integer multiple of the mask granularity (i.e., W=k(Y/X), where k=1, 2, 3 . . . ) so that each of the memory devices receives at least one complete write data value in the form of a parallel set of bits (i.e., each bit of the write data value is received on a respective data line). In alternative embodiments, the number of data lines, W, need not be an integer multiple of the mask granularity. Memory device $221_0$ is shown in expanded view to illustrate a key-based write masking operation. The memory device $221_0$, like each of the memory devices 221, includes a storage array 245, read/write circuit 243 and compare circuit 241. Each write data value received via data lines 218 is provided to the compare circuit 241 and the read/write circuit 243. A mask key 158 received via the control path 214 (or alternatively via the data path 216) is also provided to the compare circuit 241 for comparison with the incoming write data value. If the write data value matches the mask key 158, the compare circuit 241 asserts a mask signal 246 to prevent the read/write circuit 243 from writing the write data value into the storage array 245. If the write data value does not match the mask key, the compare circuit deasserts the mask signal 246 to enable the read/write circuit 243 to write the data value into the storage array 245.

Still referring to FIG. 4, the memory devices $221_0$–$221_{Z-1}$ collectively form an addressable unit of memory referred to herein as a memory rank. Each memory device within a memory rank shares the same physical address range such that, when an address is supplied on the control path 214 for a read or write access, all the memory devices within the rank are accessed at the specified address (or an address offset from the specified address). As shown in FIG. 4, one or more additional ranks of memory devices may be included within the storage subsystem 203 to increase the overall storage capacity. In one embodiment, each additional rank of memory devices is coupled in common to the control path 214 as indicated by dashed arrow 214A, and each memory device of each additional rank is coupled to a respective portion of the data path as shown by arrows $218A_0$–$218A_{Z-1}$.

Figure 5:
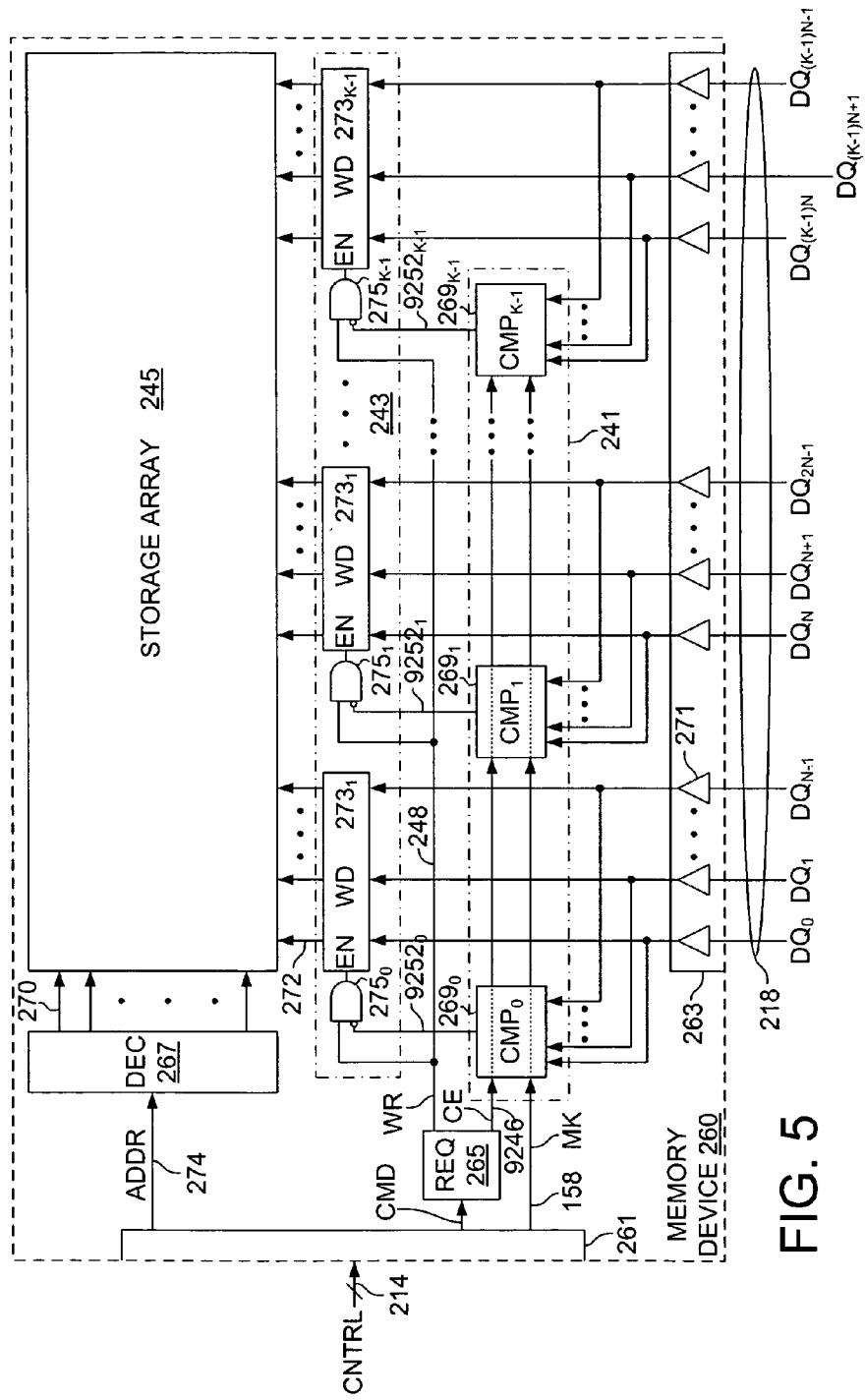
FIG. 5 illustrates a memory device according to an embodiment of the invention.

FIG. 5 illustrates an exemplary memory device 260 that may be used to implement each of the discrete memory devices 221 of FIG. 4. The memory device 260 includes a control interface 261, data interface 263, request logic 265, compare circuit 241, read/write circuit 243, address decoder 267 and storage array 245. The storage array 245 includes storage cells arranged in rows and columns, with each row of storage cells coupled to the address decoder via a respective word line 270 and each column of storage cells coupled to the read/write circuit 243 via a respective bit line 272 (or pair of bit lines in the case of differentially coupled storage cells). During a read or write access, an address 274 is received from the memory controller via the control interface 261 and supplied to the address decoder 267. The address decoder 267 decodes the address to activate a selected word line 270 (i.e., the word line specified by the address), thereby enabling read and write access to the row of storage cells coupled to the word line. In a read operation, activation of a selected word 270 line results in the data within the corresponding storage cells being supplied, via the bit lines 272, to a sense amplifier bank (not shown in FIG. 5) within the read/write circuit 243. The sense amplifier bank amplifies the relatively low level signals on the bit lines 272 to logic levels (e.g., complementary MOS levels) and outputs the amplified signals to a set of output drivers (not shown in FIG. 5) within the data interface 263 for eventual transmission to the memory controller.

In a write operation, write data values are received via receive circuits 271 within the data interface 263 and loaded into respective write drivers $273_0$–$273_{K-1}$ within the read/write circuit 243. When a write strobe signal 248 (WR) is asserted by the request logic 265, the write drivers 273 output the write data values onto the bit lines 272 for storage within the row of storage cells coupled to an activated word line 270. In the embodiment of FIG. 5, AND logic gates $275_0$–$275_{K-1}$ are provided to selectively block assertion of the write strobe signal 248 at respective enable inputs (EN) of the write drivers $273_0$–$273_{K-1}$. Each AND logic gate 275 includes a non-inverting input coupled to receive the write strobe signal 248 and an inverting input coupled to receive a respective one of match signals $9252_0$–$9252_{K-1}$ from the compare circuit 241. Referring to AND logic gate $275_0$, when match signal $9252_0$ is asserted (e.g., to a logic high state), the output of AND logic gate $275_0$ remains low even as the write strobe signal 248 goes high, thereby preventing write driver $273_0$ from outputting a write data value to the storage array 245. When the match signal $9252_0$ is deasserted, the AND logic gate $275_0$ passes the write strobe signal 248 to the enable input of the write driver $273_0$, enabling the write driver $273_0$ to output a write data value to the storage array 245.

The compare circuit 241 includes a number of comparators, $269_0$–$269_{K-1}$, each having an output coupled to the inverting input of a respective one of AND logic gates $275_0$–$275_{K-1}$, and each having inputs coupled to receive a compare enable 9246 (CE) signal from the request logic 265, the mask key 158 from the control interface 261, and a respective write data value from the data interface 263. When a write command other than a masked-write command is received within the request logic 265, the request logic 265 deasserts the compare enable signal 246 to disable the comparators 269 from asserting match signals 9252, thereby enabling the write strobe signal 248 to pass through the AND logic gates $275_0$–$275_{K-1}$ to the respective enable inputs of the write drivers $273_1$–$273_{K-1}$. When a masked-write command is received within the request logic 265, the request logic 265 asserts the compare enable signal 9246 to enable the comparators $269_0$–$269_{K-1}$ to assert match signals $9252_0$–$9252_{K-1}$, respectively. Each of the comparators 269 compares the mask key 158 with a respective one of the write data values and, if the mask key and write data value match, asserts the corresponding match signal 9252 to prevent the write strobe signal 248 from being passed to the enable input of the corresponding write driver 273. By this operation, each write data value that matches the mask key 158 is excluded from storage within the storage array 245.

Although the memory device 260 is depicted as including a multiple write drivers 273, multiple AND logic gates 275 and multiple comparators 269, the memory device 260 may alternatively have a single write driver 273, AND logic gate 275 and comparator 269, and a correspondingly reduced number of receiver circuits 271 within the data interface. Also, the storage cells within the storage array 245 may be implemented by any storage element capable of representing at least two data states. For example, in a dynamic random access memory (DRAM) device, each of the storage cells in storage array 245 is implemented by a capacitive device that may be in either a charged or discharged state to represent the two possible data states (multiple different charge levels may be used to achieve representation of more than two states, as where a single capacitive storage element is used to represent two or more bits of data). In a static random access memory (SRAM) device, a bi-stable latch circuit is used to implement each storage cell within storage array 245. Nonvolatile storage cells may also be used (e.g., floating gate devices, such as those used in flash erasable programmable read-only memory devices), as may non-semiconductor storage elements (e.g., magnetic or optical media).

Although read and write accesses within the memory device 260 have been described in terms of direct access to the storage array 245, such accesses may alternatively or additionally be directed to a page buffer within the memory device 260. For example, in the case of a DRAM device, a storage buffer (e.g., a bank of latches) may be used to temporarily store the contents of a row of the storage array 245 for subsequent read or write access directed to that row. In such a device, masked-write operations may be directed to the storage buffer as well as the larger storage array 245.

Figure 6:
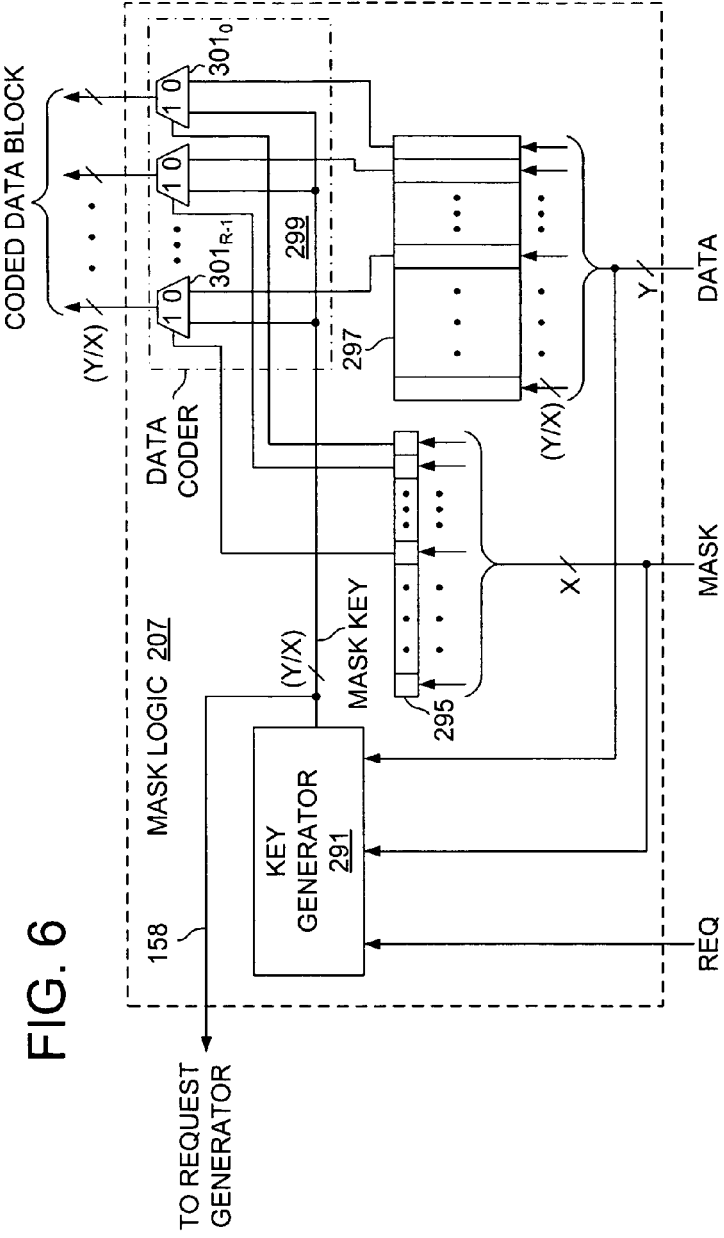
FIG. 6 illustrates the mask logic of FIG. 4 according to an embodiment of the invention.

FIG. 6 illustrates the mask logic circuit 207 of FIG. 4 according to an embodiment of the invention. The mask logic circuit 207 includes a key generator 291, mask buffer 295, write data buffer 297 and data coder 299. An incoming write data block and mask word (i.e., DATA and MASK received via the host interface) are stored in the write data buffer 297 and mask buffer 295, respectively, and are also supplied to the key generator 291 along with an incoming access request (REQ). The key generator 291 generates a mask key 158 having at least as many constituent bits as a write data value (i.e., Y/X bits, where Y is the number of bits in the write data block and X is the number of bits in the mask word; note that the mask key may have fewer constituent bits than the write data value, for example, in embodiments in which one or more of the Y/X bits of the write data value are omitted from comparison with the mask key), and outputs the mask key 158 to the data coder 299 and to the request generator (i.e., request generator 209 of FIG. 4). In one embodiment, the write data buffer 297 and mask buffer 295 are queue circuits (i.e., first-in-first-out storage circuits) that are loaded with the write data block and mask word, respectively, in one or more load operations, and then used to advance the component values of the write data block and mask word to the data coder 299 in a sequence of shift operations. For example, in one embodiment, a 64-byte write data block and corresponding 64-bit mask word are loaded into the write data buffer 297 and mask buffer 295, respectively, and thereafter output to the data coder 299 in sixteen successive transfers of four bytes and four corresponding mask bits. After each transfer of write data values and mask bits to the data coder 299, the contents of the write data buffer 297 and mask buffer 295 are advanced so that a new group of write data values and mask bits are present at the head of the write buffer and mask buffer and available for transfer to the data coder 299. The group of write data values supplied to the data coder 299 in each successive transfer operation is referred to herein as a chunk. In one embodiment, the chunk size, R (i.e., number of write data values per chunk), is a function of the width of the data path between the memory controller and storage subsystem (e.g., data path 216 of FIG. 4) and is set to enable each write data value of a given chunk to be simultaneously output onto the data path.

Still referring to FIG. 6, the data coder 299 includes a set of R selector circuits $301_0$–$301_{R-1}$ each having a first data input coupled to receive the mask key 158 from the key generator 291, a second data input coupled to receive a write data value from a respective one of the R leading storage locations within the write data buffer 297, and a select input coupled to receive a mask bit from a respective one of the R leading storage locations within the mask buffer 295. Referring to selector circuit $301_0$, as an example, if the mask bit received at the select input is high (e.g., a logic 1), the corresponding write data value is indicated to be a masked data value and the selector circuit $301_0$ selects the mask key 158 to be output to the data port (i.e., data port 215 of FIG. 4) instead of the write data value. If the mask bit is low, the write data value is an unmasked data value and is output to the data port by the selector circuit $301_0$. Thus, the data coder 299 generates the coded data block by substituting the mask key 158 for each masked data value within the incoming write data block.

Figure 7:
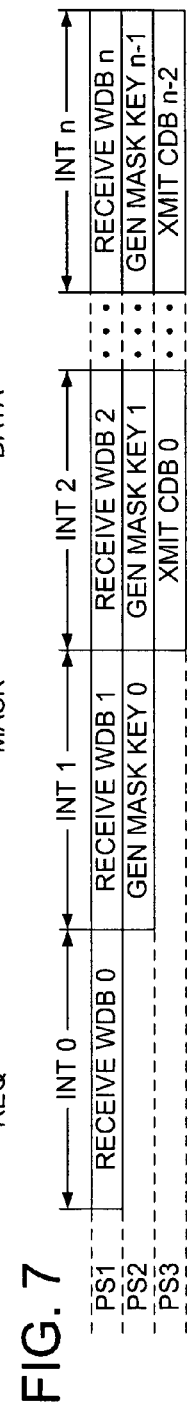
FIG. 7 illustrates an exemplary pipeline for propagation of write data blocks through the memory controller of FIG. 4.

FIG. 7 illustrates an exemplary three-stage pipeline for propagation of write data blocks through the memory controller of FIG. 4. Write data blocks, WDB0-WDBn, are received in successive intervals of a first stage of the pipeline, PS1. The write data blocks are then buffered and used to generate a mask key in successive intervals of a second stage of the pipeline, PS2. Finally, the third stage of the pipeline, the write data blocks are converted to coded data blocks (CDB) and transmitted to the storage subsystem. In the embodiment shown in FIG. 7, operations within each of the three stages of the pipeline are executed concurrently on incrementally different write data values. For example, after write data block WDB0 is received in interval 0 (INT 0), write data block WDB1 is received in interval 1 concurrently with generation of mask key 0 based on write data block WDB0. Similarly, write data block WDB2 is received in interval 2 concurrently with generation mask key 1 (based on WDB1) and concurrently with transmission of coded data block 0 (i.e., write data block 0 after mask key substitution has been performed in the data coder). In alternative embodiments, each stage of the pipeline may be decomposed into additional pipeline stages.

Figure 8:
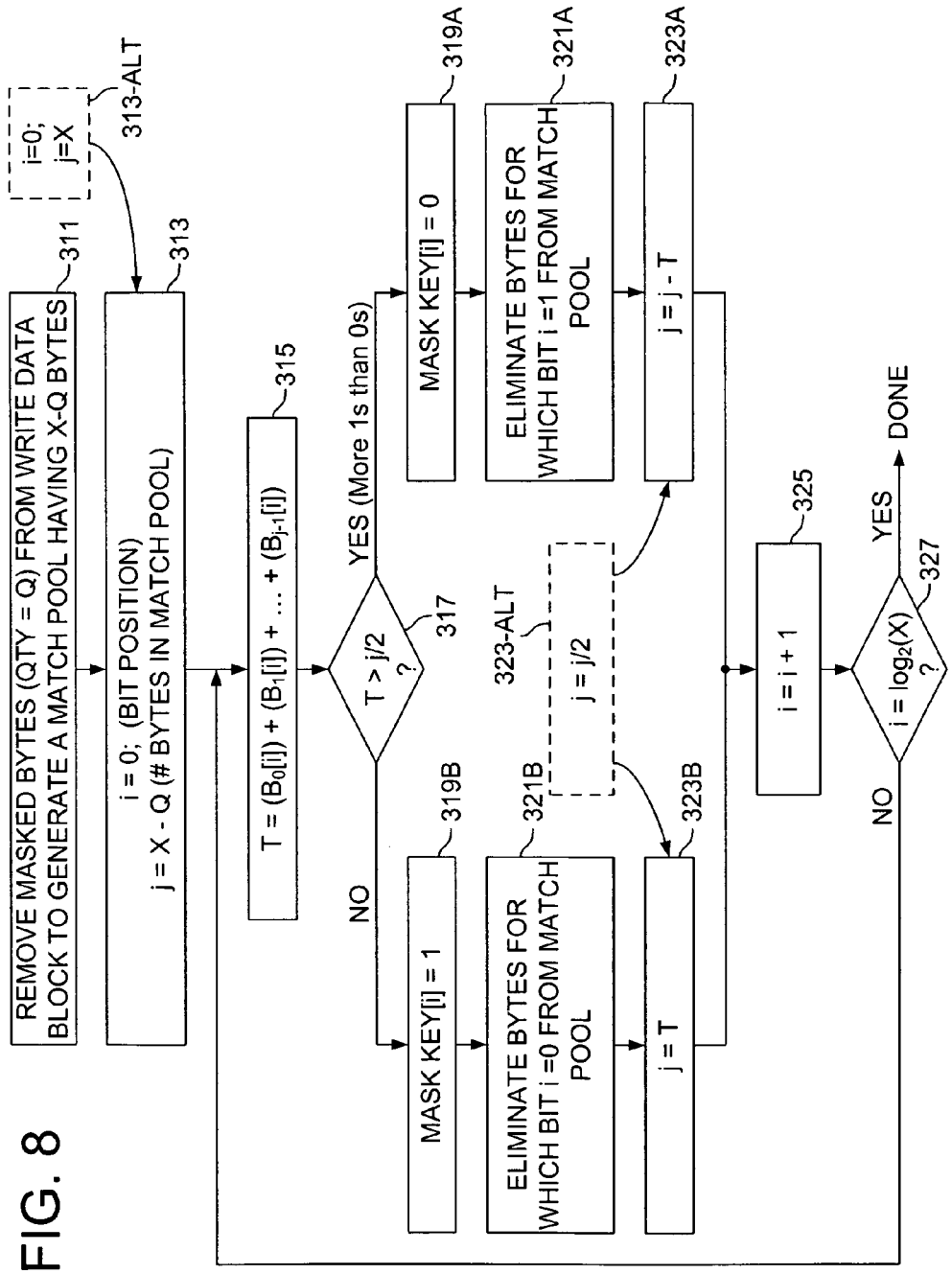
FIG. 8 illustrates the operation of the key generator of FIG. 6 according to an embodiment of the invention.

FIG. 8 illustrates the operation of the key generator 291 of FIG. 6 according to an embodiment of the invention. The operations of FIG. 8 are described in terms of byte masking, but may also be applied in systems having other mask granularities. As discussed above, the key generator operates to generate a mask key that does not match any unmasked bytes within an incoming write data block. In the embodiment of FIG. 8, the key generator achieves this result by iteratively modifying the mask key, one bit per iteration, until the number of unmasked bytes of the write data block that potentially match the mask key is reduced to zero. The group of unmasked bytes that potentially match the mask key is referred to herein as the match pool and is initially established at 311 by removing all masked bytes from the write data block. That is, assuming a write data block having X bytes and Q masked bytes (Q being at least one), and assuming an arbitrary initial value for the mask key, the mask key may potentially match all the unmasked bytes, X-Q, within an incoming write data block. At 313, bit position index i, which represents a bit position within the mask key, is initialized to zero, and the match pool size, j, which represents the number of bytes within the match pool, is initialized to X-Q. At 315, the $i^{th}$ bit of all the bytes within the match pool, $B_0$–$B_{j-1}$, are summed to produce a tally, T. Thus, in a first iteration of operation 315, the tally represents the number of 1's in the first bit position of the match-pool bytes. At 317, the tally is compared with j/2 to determine if more bytes within the match pool have a 1 at the $i^{th}$ bit position or a 0 at the $i^{th}$ bit position. If the tally is greater than j/2, then most of the bytes in the match pool have a 1 at the $i^{th}$ bit position, and the $i^{th}$ bit of the mask key, MK[i] is set to 0 in at 319A. At 321A, all the bytes having a 1 at the $i^{th}$ bit position are eliminated from the match pool as those bytes are now certain not to match the mask key. At 323A, the match pool size, j, is reduced by the value of the tally, T, to reflect the number of bytes remaining in the match pool after the elimination operation at 321A. Returning to decision operation 317, if T is less than or equal to j/2, then at least half the bytes in the match pool have a 0 at the $i^{th}$ bit position. In that case, the $i^{th}$ bit of the mask key is set to 1 at 319B, and the bytes having a 0 in the $i^{th}$ bit position are eliminated from the match pool at 321B as those bytes are now certain not to match the mask key. At 323B, the match pool size, j, is set to the value of the 1's tally, T, as that number represents the number of bytes remaining in the match pool after the elimination operation at 321B. At 325, the bit position index, i, is incremented in preparation for a tally at the next bit position. At 327, the bit position index is compared with a maximum value to determine whether the mask key generation is complete. In general, for a write data block having X write data values, at least one of which is a masked value, the maximum number of unique bit patterns in the initial match pool is X−1. Accordingly, if at least half of the bytes within the match pool are eliminated in each iteration of operations 315–323, then the match pool is guaranteed to be reduced to zero (i.e., mask key doesn't match any of the unmasked write data values within the write data block) after $\log_2(X)$ iterations of operations 319–323. For example, if the write data block includes 64 bytes, one of which is masked, then after $\log_2(64)=6$ iterations of operations 315–323, the mask key will not match any of the unmasked data bytes. Accordingly, if the bit position index i is determined to have reached $\log_2(X)$ at 327, the mask key generation operation is complete. If the bit position index has not reached $\log_2(X)$, then another iteration of operations 315–323 is performed starting with a tally of 1s at the updated bit position index at 315.

Because a different mask key bit is set or reset in each iteration of operations 315–323, only six bits of the mask key are significant from the standpoint of making the mask key unique relative to the unmasked write data values. The remaining bits of the mask key (e.g., remaining two bits in a byte-masking embodiment) may be padded with zeroes or ones. Also, the six bits that are used to establish mask key uniqueness may occur at any offset within the total number of bits allocated to the mask key. For example, in the byte-masking embodiment of FIG. 8, the bit position index could be incremented from 2 to 7 instead of 0 to 5.

The removal of masked data values from the write data block at 311 and the subsequent X-Q calculation in operation 313 may be omitted in an alternative embodiment key generation embodiment that performs one extra iteration of operations 315–323. For example, in the case of a 64-byte write data block, if at least seven bits of the mask key are assigned through respective iterations of operations 315–323, then the resulting mask key will not match any of the constituent write data bytes, even if all 64 bytes are unique. That is, because at least half of the bytes of the write data block are eliminated from the match pool in each iteration of operations 315–323, after seven iterations, a pattern guaranteed to be unique among the 128 patterns of a 7-bit value is obtained, meaning that the mask key is certain to be unique relative to the 64 bytes of the write data block.

Still referring to FIG. 8, in another alternative key generation embodiment, the match pool size, j, is initialized to X at 313-ALT (shown in dashed outline in FIG. 8), and the match pool size is halved in operation 323-ALT rather than being adjusted at 323A and 323B according to the tally determined at 315 (i.e., operation 323-ALT replaces operation 323A and operation 323B). By this approach, j represents the guaranteed maximum number of write data values in the match pool after any iteration of operations 315–321 rather than the actual size of the match pool. This alternative key generation embodiment is particularly well suited to implementation in combinatorial logic because the divide by 2 operation of 323-ALT can be achieved by right-shifting of the value j by one bit, and the arithmetic operations in 313 and 323A are avoided.

Figure 9:
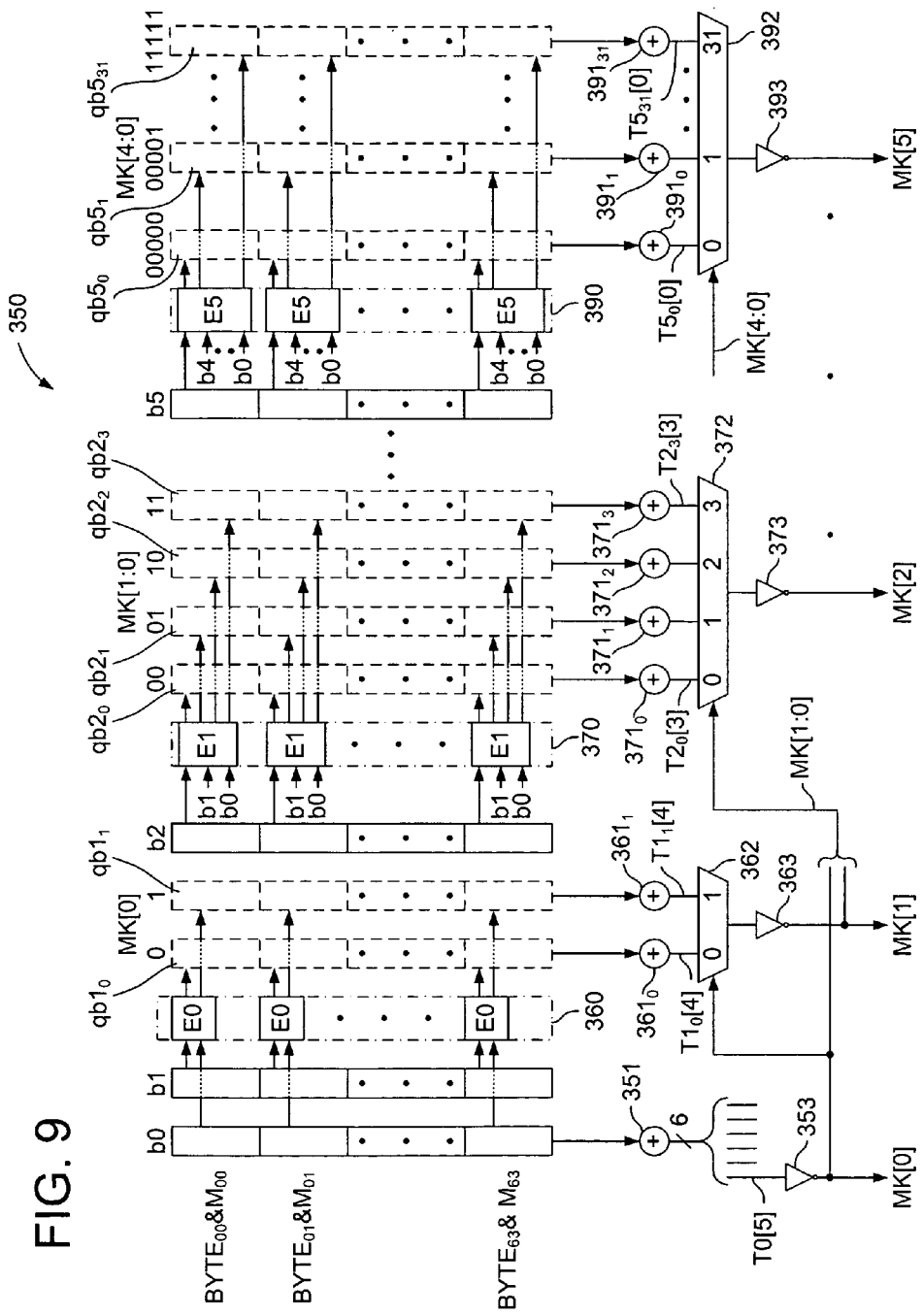
FIG. 9 illustrates a key generator according to an embodiment of the invention.

FIG. 9 illustrates an embodiment of a key generator 350 that operates according to the alternative arrangement illustrated by operations 313-ALT and 323-ALT in FIG. 8. For purposes of illustration only, the key generator 350 is assumed to operate in a byte-masking memory controller that receives 64-byte write data blocks. Other mask granularities and block sizes may be used in alternative embodiments. Initially, the bytes of an incoming write data block are logically ANDed with the complements of their respective mask bits to generate a pool of mask-qualified bytes, $BYTE_{00}$ & $M_{00}$, $BYTE_{01}$ & $M_{01}$, . . . , $BYTE_{63}$ & $M_{63}$. By this operation, each masked data value in the mask-qualified byte pool is forced to zero; an operation that corresponds to the masked byte removal operation 311 of FIG. 8. A summing circuit 351 is used to generate a 1's tally (i.e., sum of 1s) for bit 0 of each byte within the mask-qualified byte pool. Because at least one byte of the write data block is masked, the 1's tally generated by summing circuit 351 may range from 0 to 63 and therefore yields a 6-bit value, T0[5:0], in which the most significant bit, T0[5], if set, indicates that more than half the bytes in the mask-qualified byte pool have a 1 in the $0^{th}$ bit position. Accordingly, bit zero of the mask key, MK[0], is set to the complement of T0[5] by the operation of inverter 353.

The circuitry for generating bit 1 of the mask key, MK[1], includes two summing circuits 361$_0$ and 361$_1$, and an elimination circuit 360. The elimination circuit includes 64 bitwise elimination circuits, E0, each of which corresponds to a respective mask-qualified byte and generates two signals that correspond to the two possible elimination results according to the state of the $0^{th}$ bit of the mask key, MK[0]. For example, if MK[0] is 0, then all bytes of the mask-qualified byte pool for which bit 0 (b0) is 1 are to be eliminated, and if MK[0]=1, then all bytes for which b0=0 are to be eliminated. Accordingly, each of the bitwise elimination circuits, E0, generates a first qualified bit 1 (qb1$_0$) which is forced to 0 if b0=1, and set according to b1 if b0=0; and a second qualified bit 1 (qb1$_1$) which is forced to 0 if b0=0, and equal to b1 if b0=1. In Boolean notation ('&' indicating a bitwise AND operation):

$qb1_0 = b1$ & $/b0$; and $qb1_1 = b1$ & $b0$.

Summing circuit 361$_0$ sums the qb1$_0$ values for each byte in the mask-qualified byte pool to generate a 1's tally, T1$_0$[4:0], that corresponds to the elimination result when MK[0] is 0, and summing circuit 361$_1$ sums the qb1$_1$ values for each byte in the mask-qualified byte pool to generate 1's tally, T1$_1$[4:0], that corresponds to the elimination result when MK[0] is 1. Because of the eliminations performed in elimination circuit 360, the 1's tally that corresponds to the actual state of MK[0] ranges from 0 to 31 and therefore yields a 5 bit value in which the most significant bit is set if more than half the 31 possible non-eliminated bytes in the mask-qualified byte pool have a 1 in the bit 1 position. Accordingly, the most significant bits (MSBs) of the two tally values, $T1_0[4]$ and $T1_1[4]$, are input to a multiplexer 362 which selects one of the tally MSBs according to MK[0]. The selected tally MSB is then inverted by inverter 363 to form bit 1 of the mask key value, MK[1]. Thus, MK[1] is set to 0 if b1=1 for more than half the possible number of non-eliminated bytes in the mask-qualified byte pool, and MK[1] is set to 1 otherwise.

The circuitry for generating bit 2 of the mask key, MK[2] depends on twice as many previously determined mask key bits as the circuitry for generating bit 1 of the mask key and therefore includes four summing circuits $371_0$–$371_3$ instead of two, and an elimination circuit 370 that generates four, rather than two, qualified bit values per mask-qualified byte. More specifically, the elimination circuit 370 includes 64 bitwise elimination circuits, E1, each of which generates four qualified bit values, $qb2_0$–$qb2_3$, that correspond to the four possible elimination results according to the four possible states of MK[1:0]. For example, if MK[1:0]=00, then all bytes of the mask-qualified byte pool for which b1=1 and b0=1 are to be eliminated; if MK[1:0]=01, then all bytes for which b1=0 and b0=1 are to be eliminated, and so forth. Accordingly, each of the bitwise elimination circuits, D1, generates four qualified bit values, $qb2_0$–$qb2_3$, according to the following expressions:

$$qb2_0 = b2\ \&\ /b1\ \&\ /b0;$$

$$qb2_1 = b2\ \&\ /b1\ \&\ b0;$$

$$qb2_2 = b2\ \&\ b1\ \&\ /b0;\text{ and}$$

$$qb2_3 = b2\ \&\ b1\ \&\ b0.$$

Summing circuit $371_0$ sums the $qb2_0$ values for each byte in the mask-qualified byte pool to generate a 1's tally, $T2_0[3:0]$ that corresponds to the elimination result when MK[1:0]=00, and summing circuits $371_1$–$371_3$ similarly generate three separate 1's tallies, $T2_1[3:0]$–$T2_3[3:0]$, that correspond to the elimination result when MK[1:0] is 01, 10, and 11, respectively. Because of the eliminations performed in elimination circuit 370, the 1's tally that corresponds to the actual state of MK[1:0] ranges from 0 to 15 and therefore yields a 4 bit value in which the most significant bit is set if more than half the 15 possible non-eliminated bytes in the mask-qualified byte pool have a 1 in the bit 2 position. The most significant bits (MSBs) of the four tally values, $T2_0[3]$–$T2_3[3]$, are input to a multiplexer 372 which selects one of the four tally MSBs according to the MK[1:0] value. The selected tally MSB is then inverted by inverter 373 to form bit 2 of the mask key value, MK[2]. Thus, MK[2] is set to 0 if b2=1 for more than half the possible number of non-eliminated bytes in the mask-qualified byte pool, and MK[2] is set to 1 otherwise.

In the embodiment of FIG. 9, the circuitry for generating mask key bits MK[3], MK[4] and MK[5] is similar to the circuitry for generating MK[2], except that, at each stage, the number of summing circuits and the number of qualified bit values generated by the elimination circuit is doubled. Thus, the circuitry for generating MK[5] includes 32 summing circuits, $391_0$–$391_{31}$, and the elimination circuit 390 includes 64 bitwise elimination circuits, E5, each of which generates 32 qualified bit values, $qb5_0$–$qb5_{31}$, that correspond to the 32 possible elimination results according to the 32 possible states of MK[4:0]. The summing circuits $391_0$–$391_{31}$ generate 32 separate 1's tallies, $T5_0[0]$–$T5_{31}[0]$, that correspond to the 32 possible elimination results (i.e., according to MK[4:0]). Because of the eliminations performed in elimination circuit 390, the 1's tally that corresponds to the actual state of MK[4:0] ranges from 0 to 1 and therefore yields a single-bit tally which is set to 1 if the single possible remaining byte in the mask-qualified byte pool has a 1 in the bit 5 position. The 32 tally bits, $T5_0[0]$–$T2_{32}[0]$, are input to a multiplexer 392 which selects one of the 32 tally bits according to the MK[4:0] value. The selected tally bit is then inverted by inverter 393 to form bit 5 of the mask key value, MK[5]. Thus, MK[5] is set to 0 if b5=1 for the single possible remaining byte in the mask-qualified byte pool, and MK[5] is set to 1 otherwise. As discussed above, the mask key may be padded with 1s or 0s in any remaining bit positions (e.g., bit positions MK[6:7] in a byte-masking embodiment). Alternatively, the remaining bit positions may be left at arbitrary values.

Numerous changes may be made to the key generator of FIG. 9 in alternative embodiments of the invention. For example, the qualified bit values generated by each stage of elimination circuits (360, 370, . . . , 390) may be provided to the next stage elimination circuit to reduce logic redundancy. For example, the qualified bit values generated by circuits D0 may be provided to circuits D1. Also, the AND logic operation used to generate the initial match-qualified byte pool may be omitted if circuitry for generating an additional mask key bit is provided (e.g., circuitry for generating MK[6]). Moreover, the mask key may be generated in multiple bit-generating iterations rather than in a single iteration. Generally, for an N-bit mask key, the mask key generator may generate some number of mask key bits, K, per iteration, where K is less than or equal to N, feeding all computed key bits into each subsequent iteration (i.e., if more than one iteration is required). For example, if N=6 and K=1, the mask key generator will generate one mask key bit per iteration using a single summing circuit (e.g., summing circuit 351 of FIG. 9), thereby completing the mask key in six iterations. If N=6 and K=3, the mask key generator will generate three mask key bits per iteration using seven summing circuits (i.e. 1+2+4), thereby completing the mask key in two iterations. FIG. 9 illustrates an embodiment in which N=6 and K=6, using 63 summing circuits and a single iteration to generate all the mask key bits. Generally, a tradeoff exists between the amount of key-generation circuitry and the latency of the mask key generation. Accordingly, the mask key generator can be customized for virtually any values of N and K according to the goals and constraints of a particular application. While a combinatorial logic circuit for generating a mask key is shown in FIG. 9, a general purpose processor, special purpose processor, dedicated state machine or other state-based circuit may alternatively be used to generate the mask key. More generally, any circuit for generating a mask key that does not match unmasked data values within a write data block may be used without departing from the spirit and scope of the present invention.

Serialized Transfer of Write Data Values

FIG. 10 illustrates an exemplary timing diagram for the transfer of byte-sized write data values over a 32-line data path between the memory controller and storage subsystem of FIG. 4. As shown, four bytes are transferred in parallel over the data path during each of sixteen transmit intervals, thereby achieving transfer of a complete 64-byte write data block over sixteen transmit intervals. As discussed in reference to FIGS. 4 and 5, mask keys are compared to each write data value received within a constituent memory device of the storage subsystem. Thus, if the parallel data transfer scheme of FIG. 10 is used, each memory device generally requires a data interface at least as wide as the size of a write data value (i.e., at least as wide as the mask granularity). Accordingly, as shown in FIG. 11, the maximum storage capacity that can be achieved in a single-rank of memory devices 401 according to the constraints of FIG. 10 (i.e., 32-line data path and byte-mask granularity) is 4×SC bits, where SC is the maximum storage capacity of a given generation of memory devices 401. More generally, the maximum storage capacity of a single rank of memory devices is SC×(DPW)/(MG), where DPW is the width of the data path between memory controller and storage subsystem, and MG is the mask granularity. Additional ranks of memory devices may be added to increase the capacity of the storage subsystem, but the added signal drops generally result in degraded signaling performance on the data path.

FIG. 12 illustrates a data transfer scheme in an alternative embodiment of the invention that enables the per-rank storage capacity of the storage subsystem to be substantially increased. As shown, rather than transfer write data values over the data path in parallel, each write data value is transferred to the storage subsystem serially via a single data line. For example, during transmit interval 0, bit 0 of each of 32 bytes (B0–B31) is transferred to the storage subsystem via a respective line of the data path. Referring specifically to data line DQ00, bits 0–7 of byte B0 are transferred serially over data line DQ00 during respective transmit intervals 0 through 7. Bytes B1–B31 are similarly transferred serially over data lines DQ01–DQ31, respectively, during transmit intervals 0–7. During transmit intervals 8–15, the remaining bytes of the write data block, B32–B63, are transferred serially over data lines DQ00–DQ31, respectively. By serially transferring write data values in this manner, the data interface of each memory device within the storage subsystem may be made as narrow as a single bit and coupled to a corresponding one of the 32 data lines (more or fewer data lines may be used in an alternative embodiment). As shown in FIG. 13, such an arrangement enables 32 SC-sized memory devices 403 to be used per rank of the storage subsystem, effectively multiplying the per-rank storage capacity of the storage subsystem by the size of a write data value. For example, in a byte-masking memory system having a 32-line data path, the per-rank storage capacity of the storage subsystem is increased by a factor of 8, from the 4×SC capacity of FIG. 11 to the 32×SC capacity of FIG. 13. The increase in per-rank storage capacity becomes even more pronounced at larger mask granularities.

FIG. 14 illustrates the data port 421 of a serial-transfer memory controller 420 according to an embodiment of the invention. The data port 421 includes a set of K output drivers, $425_0$–$425_{K-1}$, and a corresponding set of K serializing circuits $423_0$–$423_{K-1}$. A respective N-bit write data value is loaded into each of the serializing circuits 423 after every Nth cycle of a transmit clock signal 422, TCLK, and then shifted out of the serializing circuit 423, one bit at a time, during each of the following N cycles of TCLK. By this arrangement, after a write data value is shifted out of a given serializing circuit 423, the serializing circuit is reloaded with a new write data value, if available. Each of the output drivers is coupled to the output signal line 426 of a respective serializing circuit to receive the serial stream of bits that form a write data value. In the embodiment of FIG. 14, each output driver $425_0$–$425_{K-1}$ transmits a constituent bit of a write data value on a corresponding one of data lines $DQ_0$–$DQ_{K-1}$ during each cycle of the transmit clock signal 422. Alternatively, the output drivers 425 may transmit in response to a clock signal that is phase offset from the clock signal used to control the shift operations within the serializing circuits 423. Also, in one embodiment, the serializing circuits 423 and output drivers 425 respond to both edges of the transmit clock signal 422, the N bits of a write data value being shifted out of a given serializing circuit after N/2 clock cycles of the transmit clock signal 422, and two bits of the write data value being transmitted one after the other on the corresponding data line per cycle of the transmit clock signal 422. In yet another embodiment, the output drivers 425 are multi-level output drivers capable of conveying two or more bits in a single signal transmission (e.g., transmitting one of four possible signal levels to convey a two-bit symbol per transmission). In such an embodiment, the clock signal used to clock the output drivers 425 may be operated at a lower frequency than the clock signal used to control the shift operations within the serializing circuits 423 (e.g., half the frequency in the case of a two-bit symbol transmission). Alternatively, two bits may be output from each serializing circuit 423 in each shift operation.

FIG. 15 illustrates an exemplary embodiment of a serializing circuit 430 that may be used within the data port 421 of FIG. 14. The serializing circuit 430 includes a shift register 433 and a modulo N counter 431 each coupled to receive a transmit clock signal 422 (TCLK). The modulo N counter 431 is incremented in response to each rising and/or falling edge of TCLK and repeatedly counts from 0 to a terminal count of N–1, asserting a load signal 432 to the shift register 433 when the terminal count is reached. The shift register responds to assertion of the load signal 432 by loading N bits of a write data value 434 into a corresponding set of N storage elements within the shift register. The $0^{th}$ bit of the write data value is stored at a head storage element 435 of the shift register 433 and output onto signal line 426 (i.e., to be received by an output driver). After the write data value 434 is loaded into the shift register 433, the constituent bits of the write data value are shifted forward one bit at a time (i.e., shifted toward the head storage element 435) in response to rising and/or falling edges of TCLK. By this arrangement, each bit of the write data value is shifted in turn to the head storage element 435 of the shift register 433 and output onto signal line 426. In an alternative embodiment, the write data value 434 may be shifted out most significant bit first. Also, two or more shift registers 433 may be provided to supply more than one bit to an output driver at a time, as in the case of a multi-level output driver.

FIG. 16 illustrates a serial-transfer memory device 440 according to an embodiment of the invention. The memory device 440 includes a control interface 261, data interface 441, storage array 245, request logic 265, comparator 269, AND logic gate 275 and write driver 273. Though not specifically shown, the write driver 273 and logic gate 275 form part of a read/write circuit that includes a bank of sense amplifiers coupled to the storage array via bit lines 272. The control interface 261, storage array 245, request logic 265, address decoder 267, comparator 269, write driver 273 and AND logic gate 275 operate generally as described above in reference to FIG. 5, but the data interface 441 is modified to enable receipt of a write data value via a single data line, DQ. More specifically, the data interface 441 includes a receiver circuit 271 and deserializing circuit 443 each coupled to receive a receive clock signal 442 (RCLK). The receive circuit 271 samples the signal line DQ in response to each rising and/or falling edge of the receive clock signal 442 and outputs the sampled bits one after another to the deserializing circuit 443. In one embodiment, the deserializing circuit 443 is a shift circuit that is loaded bit by bit in response to respective transitions of the receive clock signal 442. That is, as the receive circuit 271 outputs each sampled bit, the bit is shifted into the deserializing circuit 443 to reconstruct the write data value that was serialized by the memory controller. In a multi-level signaling embodiment (i.e., each symbol received by the receive circuit 271 represents more than one bit of information) the receive circuit 271 may output two or more bits per received symbol, with the two or more bits being strobed into the deserializing circuit 443 in response to each transition of the receive clock signal 442. After every N transitions of the receive clock signal 442 (i.e., each transition occurring on a rising edge, falling edge, or both) a complete write data value has been shifted into the deserializing circuit 443 and, in the case of a masked-write operation, the request logic 265 asserts the compare enable signal 9246 to enable the comparator 269 to compare the write data value with the mask key 242 received via the control interface 261. If the mask key and write data value match, then the write data value is a masked data value and the comparator 269 asserts a mask signal 252 to prevent storage of the write data value. That is, as described in reference to FIG. 5, the asserted mask signal 252 prevents a write strobe signal 248 generated by the request logic from being asserted the enable input of the write driver 273. If the write data value from the deserializing circuit 443 does not match the mask key 242, the comparator 269 does not assert the mask signal 252, and the write strobe signal 248 is passed via AND logic gate 275 to the enable input of the write driver 273, thereby enabling the write driver 273 to store the write data value within the storage array 245.

Still referring to FIG. 16, the receive circuit 271, deserializing circuit 443, comparator 269, AND logic gate 275 and write driver 273 form a write data channel within the memory device 440. While only one such write data channel is depicted in the embodiment of FIG. 16, multiple write data channels may alternatively be provided, with the receive circuit 271 for each write data channel being coupled to a respective external data line, DQ.

Key Selecting Embodiment

In the exemplary memory systems described in reference to FIGS. 4–9 and 14–16, a memory controller generates a mask key for each incoming write data block, then transfers the mask key to a storage subsystem. In the case of a 64-byte write data block having byte-mask granularity, transfer of an 8-bit mask key instead of 64 discrete mask signals (i.e., the discrete mask signals described in reference to FIG. 1) achieves an 8:1 reduction in the amount of mask information transferred between memory controller and storage subsystem. In terms of the overall interface between memory controller and storage subsystem, a bandwidth savings of 56 bits per write data block is achieved.

In an alternative embodiment of the invention, referred to herein as a key selecting embodiment, even greater bandwidth savings and greater reduction of mask information transfer are achieved. In the key selecting embodiment, the memory controller selects a mask key from a table of predetermined mask keys, then supplies a value representative of the selected mask key (referred to herein as a key selector) to the storage subsystem. The memory controller uses the selected mask key to generate a coded data block then outputs the coded data block to the storage subsystem in either the parallel-transfer or serial-transfer modes described in reference to FIGS. 10 and 12. Each of the memory devices (or memory device) that form the storage subsystem includes the table of predetermined mask keys and selects one of the predetermined keys according to the key selector received from the memory controller. Each memory device then uses the selected mask key in the manner described above in reference to FIGS. 5 and 16 to identify masked data values and exclude the masked data values from storage in the storage subsystem.

Because the key selector may have significantly fewer bits than a mask key value (the mask key being sized according to the mask granularity), transfer of the key selector to the storage subsystem instead of a mask key may achieve additional bandwidth savings in the path between memory controller and storage subsystem and achieve further reduction in mask information transfer. For example, in one embodiment, the key selector is a single-bit value used to select between two predetermined mask keys. Transferring the key selector instead of, for example, an 8-bit mask key achieves an 8:1 reduction in mask key information transferred from the memory controller to storage subsystem. Compared to the 64 mask bits transferred from memory controller to storage subsystem in the prior art system described in reference to FIG. 1, transferring a single-bit key selector value achieves a 64:1 reduction in mask information transfer.

FIG. 17 illustrates the operation of a key selecting memory controller according to an embodiment of the invention. Byte-masking granularity is assumed for purposes of description, but other mask granularities may be used in alternative embodiments. At 475, a write data block having X constituent bytes is received via the host interface. At 477, a first predetermined mask key, mask key A, is compared against each of the unmasked bytes within the write data block. If none of the unmasked bytes match mask key A (decision block 479), then at 481 mask key A is assigned to be the selected mask key (SMK), and the key selector (KSEL) is set to a value that corresponds to mask key A (KSEL=0 in this example). Returning to decision block 479, if any one of the unmasked bytes of the write data block is determined to match mask key A, then at 487 each of the unmasked bytes is compared with a second predetermined mask key, mask key B. If none of the unmasked bytes of the write data block match mask key B (decision block 489), then at 491 mask key B is assigned to be the selected mask key, and the key selector is set to a corresponding value (KSEL=1 in this example).

If at least one of the predetermined mask keys is determined not to match any of the unmasked bytes of the write data block, then at 483 a coded data block is generated by substituting the selected mask key for each masked byte within the write data block. At 485, the coded data block and the key selector are transmitted to the storage subsystem.

If neither of the predetermined mask keys is determined to be unique relative to the unmasked bytes of the write data block (i.e., each mask key matches at least one unmasked byte resulting in affirmative determinations at 479 and 489), then a condition referred to herein as a mask conflict has arisen. In the embodiment of FIG. 17, the mask conflict is resolved through a two-phase masked-write operation. In the two-phase masked-write operation, a first phase masked-write operation is executed using mask key A, and a second phase masked-write operation is executed using mask key B. That is, at 493, mask key A is assigned to be the selected mask key (and the key selector set to 0) and the operations 483 and 485 are executed (indicated by the circled 'A' at 495) to complete the first phase masked-write operation, then at 497, mask key B is assigned to be the selected mask key (and the key selector set to 1) and the operations 483 and 485 are executed a second time (indicated at 499) to complete the second phase of the two-phase masked-write operation. Because of the mask conflict, one or more unmasked bytes that match mask key A will inadvertently be masked during the first phase of the two-phase masked-write, but written during the second phase.

Figure 19:
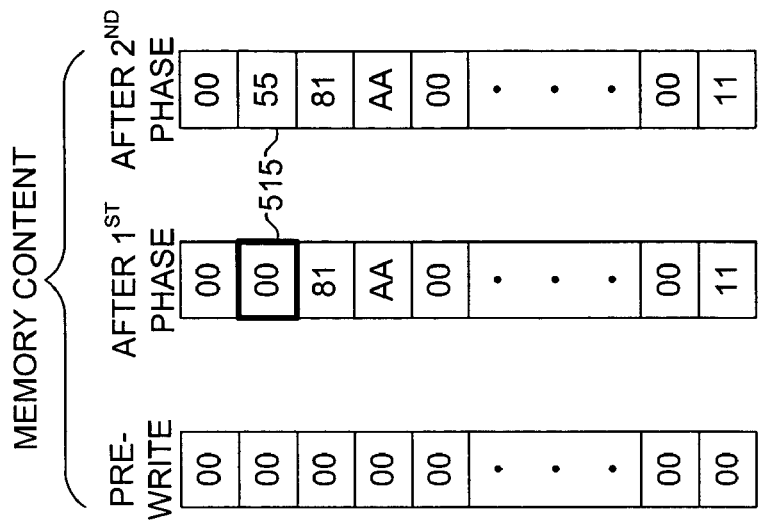
FIG. 19 illustrates the content of a storage subsystem before and after each phase of the two-phase masked-write operation of FIG. 18.
Figure 18:
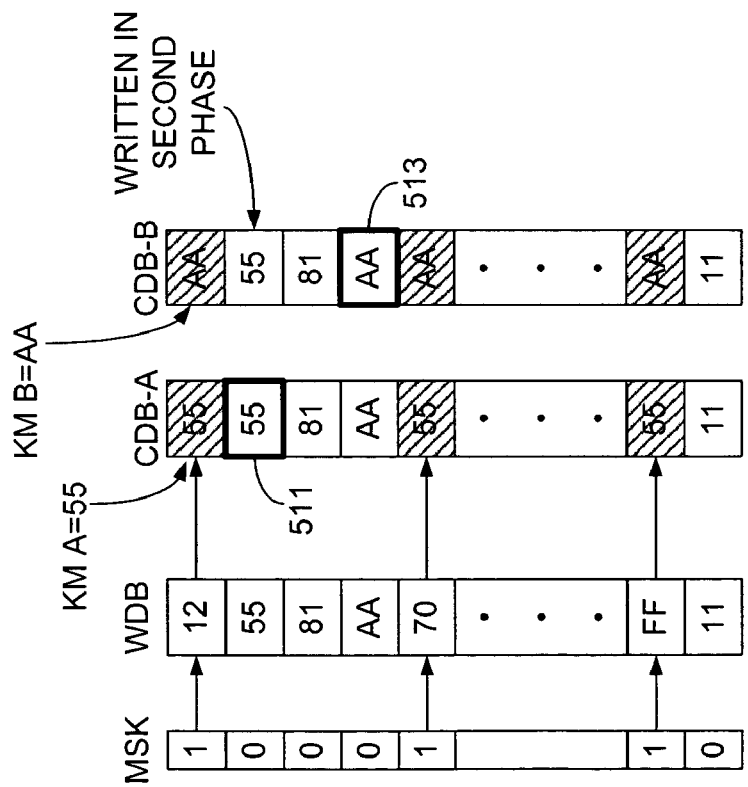
FIG. 18 illustrates a two-phase masked-write operation applied to an exemplary write data block and corresponding mask word.

FIG. 18 illustrates a two-phase masked-write operation applied to an exemplary write data block (WDB) and corresponding mask word (MSK). For purposes of example only, byte-mask granularity is assumed, and mask keys A and B are assumed to be hexadecimal values 55 (binary value 01010101) and AA (binary value 10101010), respectively. A mask conflict exists in the scenario shown because the write data block contains unmasked values that match both mask key A and mask key B (i.e., unmasked values of 55 and AA, respectively). Accordingly, mask key A is assigned to be the selected mask key for purposes of generating a coded data block, CDB-A, to be written in a first phase of a two-phase masked-write operation. As shown by the shaded '55' entries in coded data block CDB-A, mask key A is substituted for masked bytes within the write data block (i.e., 12, 70 and FF) to generate the coded data block, CDB-A. Also, as shown by the bold box 511 in coded data block CDB-A, the unmasked 55 value in the write data block, by happenstance, matches mask key A and therefore will be treated like a masked data value within the storage subsystem. FIG. 19 illustrates the content of the storage subsystem before and after each phase of the two-phase masked-write operation. For purposes of example, the storage area to which the masked-write operation is directed is assumed to contain zero-valued entries. Accordingly, after the first phase of the two-phase masked-write operation, all the storage locations are updated with write data bytes except for those locations for which the corresponding write data byte matches mask key A. Consequently, the storage location 515 which corresponds to the unmasked 55 value in the original write data block is not updated in the first phase of the two-phase masked-write operation, even though the intent of the host-requested write operation was to write the value 55 into storage location 515.

Referring again to FIG. 18, in the second phase of the two-phase masked-write operation, mask key B is substituted for each masked byte within the write data block WDB as indicated by the shaded, AA-valued entries. As shown by the bold box 513, the unmasked AA value, by happenstance matches mask key B and therefore will be treated like a masked data value within the storage subsystem. Referring to FIG. 19, in the second phase of the two-phase masked-write operation, all the storage locations are updated with write data bytes except for those locations for which the corresponding write data byte matches mask key B. Because the unmasked 55 value now does not match the mask key value, the unmasked 55 value is written in location 515 as originally intended. Even though the unmasked M value inadvertently matches the mask key value and is not written in the second phase of the two-phase masked-write operation, the unmasked AA value was already written in the first phase write operation. Thus, the first and second phase write operations complement one another by achieving storage of the unmasked value that, by happenstance, matches the mask key value for the counter-part phase of the two-phase masked-write operation.

It should be noted that execution of a two-phase masked-write operation, though effective for resolving a mask conflict, has the undesirable characteristic of requiring two masked-write accesses to the storage subsystem instead of one. Consequently, the greater the frequency of two-phase masked-write operations, the lower the effective memory bandwidth of the memory system. One direct way to reduce the frequency of two-phase masked-write operations is to increase the number of predetermined mask keys from which the mask key is selected. As a statistical matter, assuming a set of R predetermined mask keys and a population of X write data values each having a unique pattern of N constituent bits, each additional mask key decreases the likelihood of a mask conflict by a factor of $(X-R)/(2^N-R)$. For example, in a system having a population of 64 write data values (one masked), byte-mask granularity, and two predetermined mask keys, the likelihood of a mask conflict in the population is $(63/256)*(62/255)=\sim 6\%$. If two additional predetermined mask keys are provided, the likelihood of a mask conflict is reduced to $(631256)*(62/255)*(61/254)*(60/253)=\sim 0.34\%$. Letting P represent the number of predetermined mask keys, the number of constituent bits required in the key selector is $\log_2(P)$. In general, so long as $\log_2(P)$ is smaller than the mask granularity, a bandwidth savings is achieved over a mask-key-transfer embodiment.

Other techniques for reducing the likelihood of mask conflicts include choosing the set of predetermined mask keys according to known or anticipated bias within the write data population. For example, in systems which use hexadecimal values FF and 00 to represent true and false Boolean states, using patterns other than FF and 00 for each of the predetermined mask keys may reduce the likelihood of a mask conflict. Another approach to reducing mask conflicts is to subdivide the write data block into two or more sub-blocks, thereby reducing the population size, X, in the mask conflict probability expression $(X/2^N)*((X-1)/2^N-1))* \ldots *((X-R)/(2^N-R))$. Assuming that X>>R, for example, subdividing the write data block into N sub blocks reduces the probability of a mask conflict by ~N.

Figure 20:
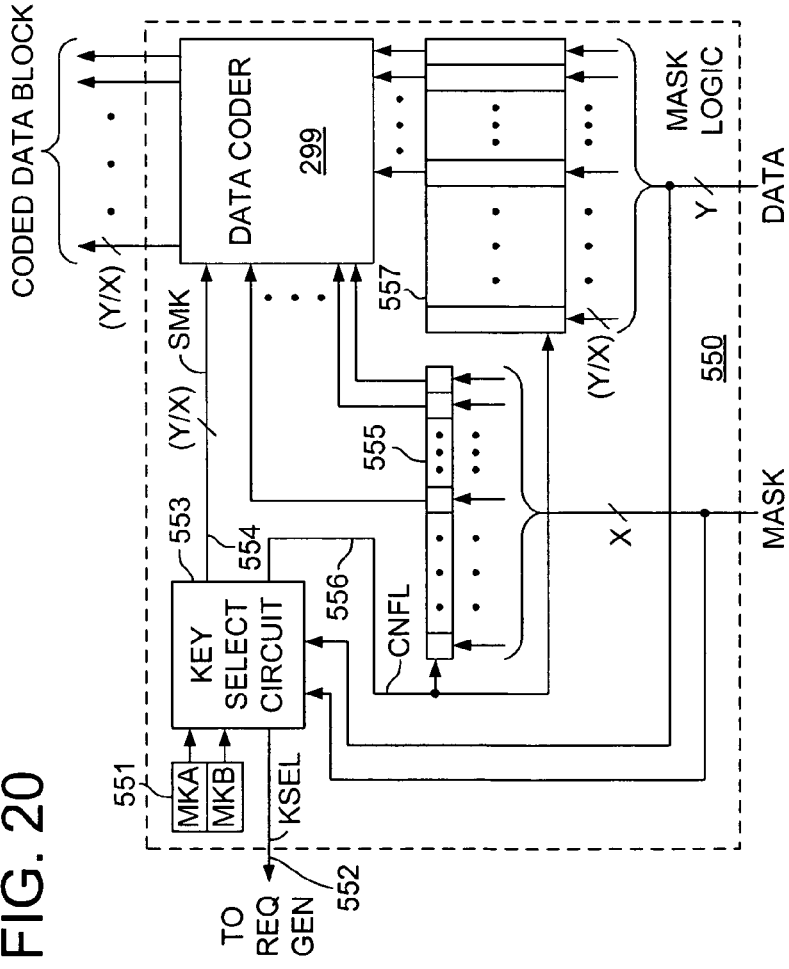
FIG. 20 illustrates a key-selecting mask logic circuit according to an embodiment of the invention.

FIG. 20 illustrates a key-selecting mask logic circuit 550 according to an embodiment of the invention. The mask logic circuit 550 includes a mask key table 551, key select circuit 553, mask buffer 555, write data buffer 557 and data coder. The mask buffer 555, write data buffer 557 and data coder 299 operate generally as described above in reference to FIG. 6 to generate a coded data block based on an incoming mask word (MASK) and write data block (DATA). Instead of receiving a mask key from a key generator, however, the data coder 299 receives a predetermined mask key selected from the mask key table 551 by the key select circuit 553. That is, the key select circuit 553 selects one of the predetermined mask keys from mask key table 551 to be a selected mask key 554 (SMK) and supplies the selected mask key 554 to the data coder for generation of the coded data block. The key select circuit 553 also generates a key selector 552 that corresponds to the selected mask key 554, and outputs the key selector 552 to the request generator. Thus, the request generator receives and forwards the key selector 552 instead of a mask key.

In one embodiment, the mask key table 551 includes a bank of programmable storage circuits that are programmed with host-supplied mask keys during system initialization. The programmable storage circuits may be implemented using volatile or non-volatile storage elements and, in the case of non-volatile storage elements may alternatively be programmed during system production or in a configuration-setting operation. In an alternative embodiment, the mask key table 551 includes a hard-wired set of mask keys (e.g., achieved through dedicated circuit design or through one-time programmable operation such as a fuse-blowing programming operation). Also, while the mask key table 551 is depicted as including two predetermined mask keys (MKA and MKB) in FIG. 20, the mask key table 551 may include more than two predetermined mask keys in alternative embodiments.

The key select circuit 553 is coupled to receive the mask word and write data block from the host interface, as well as the predetermined mask keys from the mask key table 551. In one embodiment, the key select circuit 553 is implemented by combinatorial logic that compares each of the predetermined mask keys in the mask key table 551 with the unmasked write data values of the write data block and, if at least one of the predetermined mask keys is unique relative to the unmasked write data values, generates a key selector that selects the unique predetermined mask key to be the selected mask key 554. If none of the predetermined mask keys is unique relative to the unmasked write data values (i.e., each mask key in the mask key table 551 matches at least one unmasked write data value), the key select circuit 553 selects a first default mask key from the mask key table 551 (e.g., mask key A) and asserts a conflict signal 556 to indicate the mask conflict condition. In the embodiment of FIG. 20, the conflict signal 556 is supplied to the mask buffer and write data buffer to maintain the content of those buffers through first and second phases of a two-phase masked-write operation. That is, the conflict signal 556 is asserted to prevent the contents of the mask buffer 555 and write data buffer 557 from being overwritten by an incoming mask word and write data block. The conflict signal 556 may additionally, or alternatively, be supplied to other control circuitry within the memory controller to enable the control circuitry to prevent the mask buffer and write data buffer from being overwritten before completion of the two-phase masked-write operation. Such control circuitry may also output a busy signal to notify access requesters that the memory controller is temporarily unable to receive a write data block.

Still referring to the mask conflict condition, the first default mask key is supplied to the data coder 299 as the selected mask key 554 for the first phase of a two-phase masked-write operation. After the coded data block (generated using the first default mask key) and selected mask key 554 are output to the storage subsystem, a second default mask key (e.g., mask key B) is selected by the key select circuit and provided to the data coder as the selected mask key. The second default mask key is then used to generate the coded data block for the second phase of the two-phase masked-write operation.

Figure 21:
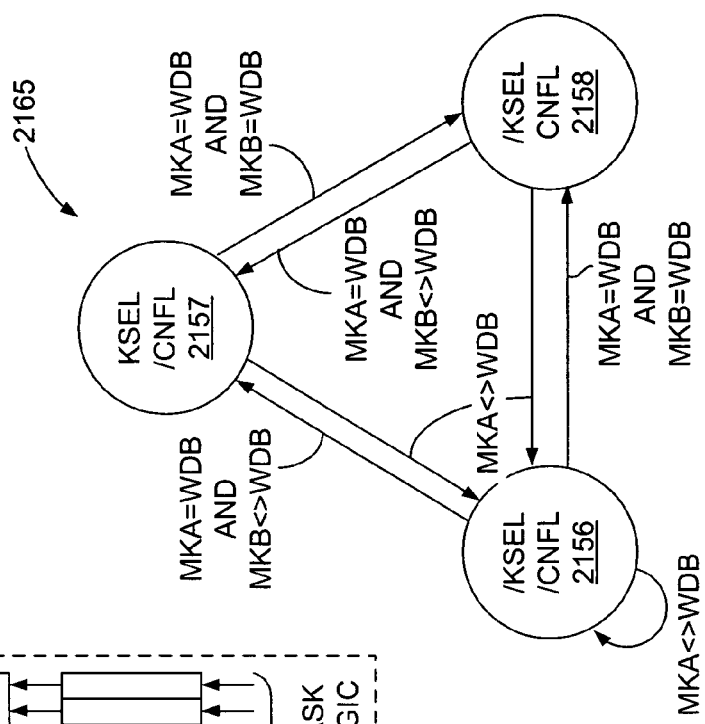
FIG. 21 illustrates an exemplary state diagram implemented by the key select circuit of FIG. 20.

FIG. 21 illustrates an exemplary state diagram 2165 implemented by the key select circuit 553 of FIG. 20. Initially, the key select circuit 553 is in state 2156, and outputs logic low key selector and conflict signals (i.e., /KSEL, /CNFL). The key select circuit remains in state 2156 so long as mask key A (MKA) does not match any unmasked data values within an incoming write data block (i.e., MKA<>WDB). If mask key A matches one or more unmasked data values within an incoming write data block, and mask key B does not match any unmasked data values within the write data block (i.e., (MKA=WDB) AND (MKB<>WDB)), then the key select circuit transitions to state 2157. In state 2157, the conflict signal remains low, but the key selector goes high to select mask key B for use in generating the coded data block. When the next write data block is received, the key logic returns to state 2156 if mask key A does not match any unmasked data values. If the mask key A matches an unmasked data value within the write data block, but mask key B does not, the key select circuit remains in state 2157. Whether in state 2156 or 2157, if mask key A and mask key B are each determined to match an unmasked data value within an incoming write data block, then a mask conflict has occurred and the key select circuit transitions to state 2158. The key selector remains in state 2158 for the duration of a two-phase masked-write operation, then transitions to either state 2156 or 2157 if no mask conflict is detected within the next write data block (i.e., transitioning to state 2156 if mask key A matches an unmasked write data value within the write data block and to state 2157 otherwise).

Figure 22:
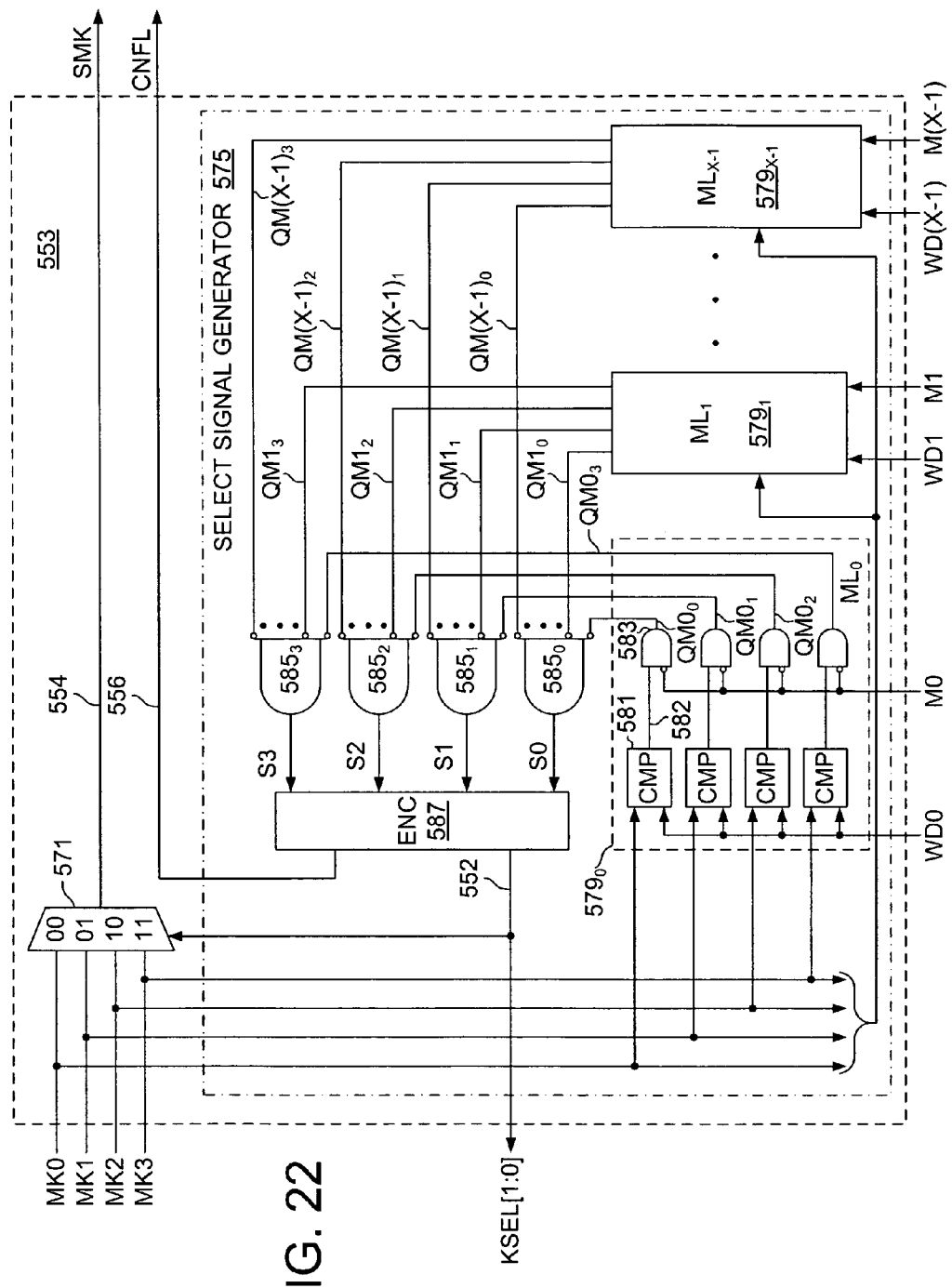
FIG. 22 illustrates the key select circuit of FIG. 20 according to an embodiment of the invention.

FIG. 22 illustrates the key select circuit 553 of FIG. 20 according to an embodiment of the invention. The key select circuit 553 includes a multiplexer 571 and a select signal generator 575, each coupled to receive the predetermined mask keys from the key table. Four predetermined mask keys, MK0–MK3, are assumed in the exemplary embodiment of FIG. 22, though more or fewer mask keys may alternatively be used. The select signal generator 575 receives the write data block and mask word as inputs and generates the key selector 552 and conflict signal 556 described in reference to FIG. 21. In the embodiment of FIG. 22, the key selector 552 is a 2-bit signal, KSEL[1:0] and is supplied to a select input of the multiplexer 571 to select one of the four predetermined mask keys to be output as the selected mask key 554 (SMK).

The select signal generator 575 includes a set of X match detect circuits $579_0$–$579_{X-1}$ (MD), AND logic gates $585_0$–$585_3$, and encoder 587. Each of the match detect circuits 579 is coupled to receive the four predetermined mask key values, MK0–MK3, from a key table, along with a respective one of the X write data values of the write data block and a corresponding mask bit of the mask word. Each of the match detect circuits 579 generates a respective set of qualified match signals (i.e., $QM0_{0-3}, QM1_{0-3}, \ldots, QM(X-1)_{0-3}$) that correspond to the predetermined mask keys MK0–MK3, each qualified match signal indicating whether the corresponding mask key matches an unmasked write data value. Referring to the detail view of match detect circuit $579_0$, as an example, each predetermined mask key is compared with write data value, WD0 (i.e., a write data value of the incoming write data block), in a respective one of comparators 581. If the write data value and predetermined mask key received by a given comparator 581 match, the comparator outputs a logic high match signal on a corresponding one of match lines 582. The match lines 582 are coupled to inputs of respective AND logic gates 583, with each of the AND logic gates having an inverting input coupled in common to receive mask bit, M0. Accordingly, each of the AND logic gates 583 outputs a respective qualified match signal in a logic high state if a match is signaled by the corresponding comparator 581 and the write data value is unmasked (i.e., mask bit M0 is low). Expressed in analytic form, each of the X mask detection circuits $579_0$–$579_{X-1}$ ($MD_0$–$MD_{X-1}$) in the exemplary embodiment of FIG. 22 outputs four qualified match signals as follows:

$MD_0$: $QM0_0$: (WD0=MK0) & /M0
$QM0_1$: (WD0=MK1) & /M0
$QM0_2$: (WD0=MK2) & /M0
$QM0_3$: (WD0=MK3) & /M0
$MD_1$: $QM1_0$: (WD1=MK0) & /M1
$QM1_1$: (WD1=MK1) & /M1
$QM1_2$: (WD1=MK2) & /M1
$QM1_3$: (WD1=MK3) & /M1
•
•
•
$MD_{X-1}$: $QM(X-1)_0$: (WD(X-1)=MK0) & /M(X-1)
$QM(X-1)_1$: (WD(X-1)=MK1) & /M(X-1)
$QM(X-1)_2$: (WD(X-1)=MK2) & /M(X-1)
$QM(X-1)_3$: (WD(X-1)=MK3) & /M(X-1)

Still referring to FIG. 22, the qualified signals $QM0_0$, $QM1_0$, ..., $QM(X-1)_0$ all correspond to mask key MK0 (each indicating whether MK0 matches a respective unmasked data value within the write data block), and are supplied to respective inverting inputs of AND logic gate $585_0$. Thus, if all the qualified match signals corresponding to MK0 are low, the output of AND logic gate $585_0$ (i.e., S0) will be high to indicate that MK0 does not match any unmasked data values within the write data block. Similarly, qualified match signals $QM0_1$, $QM1_1$, ..., $QM(X-1)_1$ all correspond to MK1 and are supplied to inverting inputs of AND logic gate $585_1$; qualified match signals $QM0_2$, $QM1_2$, ..., $QM(X-1)_2$ all correspond to MK2 and are supplied to inverting inputs of AND logic gate $585_2$; and qualified match signals $QM0_3$, $QM1_3$, ..., $QM(X-1)_3$ all correspond to MK3 and are supplied to inverting inputs of AND logic gate $585_3$. Thus each of the AND logic gates $585_0$–$585_3$ will output a logic high signal if the corresponding mask key, MK0–MK3, does not match any unmasked data values within the write data block. The outputs of the AND logic gates $585_0$–$585_3$ (i.e., signals S0–S3, respectively) are supplied to the encoder 587 where they are used to set the states of the key selector 552 and conflict signal 556. In one embodiment, the encoder 587 generates a key selector 552 that corresponds to the lowest numbered match key for which the output of the corresponding one of signals S0–S3 is high. That is, KSEL[1:0] is set to 00 to select MK0 if S0 is high; 01 to select MK1 if S0 is low and S1 is high; 10 to select MK2 if S0 is low, S1 is low and S2 is high; and 11 to select MK3 if S0 is low, S1 is low, S2 is low and S3 is high. If signals S0–S3 are all low, then none of the mask keys MK0–MK3 are unique relative to the write data block and a conflict condition exists. In the embodiment of FIG. 22, the encoder 587 asserts the conflict signal 556 to indicate the mask conflict condition, and sets the key selector 552 to select mask key MK0 to be the default mask key for a first phase of a two-phase masked-write. After the first phase of the two-phase masked-write, the encoder 557 sets the key selector to select mask key MK1 to be the default mask key for the second phase of the two-phase masked-write. Other key table selections may be used as the default mask keys for the first and/or second phases of the two-phase masked-write in alternative embodiments.

Figure 23:
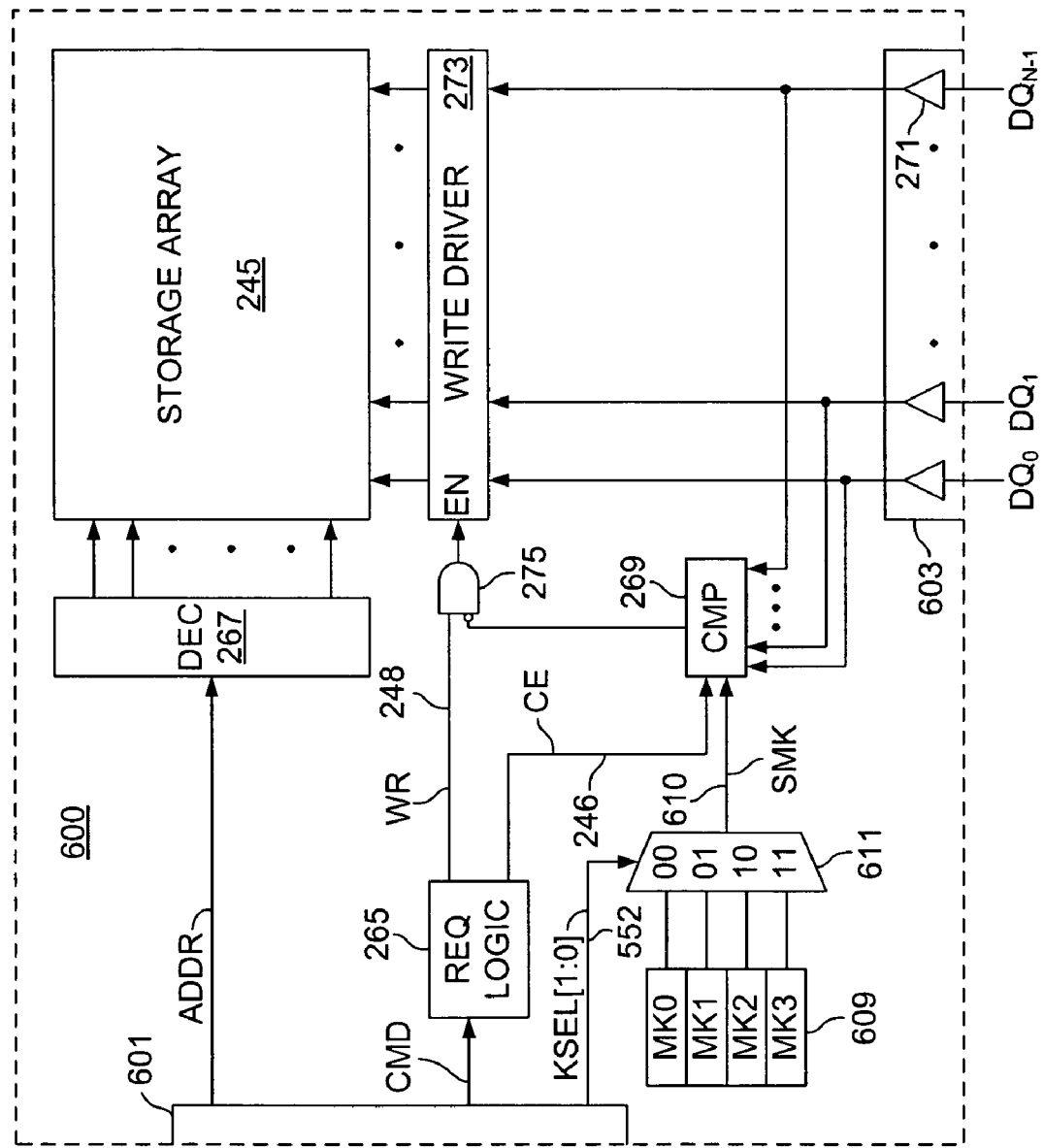
FIG. 23 illustrates a memory device according to a key-selecting embodiment of the invention.

FIG. 23 illustrates a memory device 600 according to a key-selecting embodiment of the invention. The memory device 600 includes a host interface 601, data interface 603, address, decoder 267, request logic 265, key table 609, multiplexer 611, comparator 269, write driver 273 and AND logic gate 275. The data interface 603 (including receiver circuits 271), address decoder 267, request logic 265, comparator 269, write driver 273 and AND logic gate 275 all operate generally as described above in reference to FIG. 5, although the data interface 603 may alternatively be a deserializing data interface as described in reference to FIG. 16. The host interface 601 also operates as described in reference to FIG. 5 except that a key selector 552 is received instead of a mask key. The key selector 552 is supplied to a select input of the multiplexer 611 to select a mask key from the key table 609, the selected mask key 610 being provided to the comparator 269 for comparison with an incoming write data value (i.e., when the comparator 269 is enabled by the compare enable 9246 signal from the request logic 265). Note that while a single write data channel is shown in FIG. 23, the memory device 600 may alternatively have any number of write data channels in alternative embodiments (i.e., wider data interface 603, multiple comparators 269, multiple write drivers 273 and AND logic gate 275 as in FIG. 5).

In the embodiment of FIG. 23, the key table 609 includes four predetermined mask keys, and the incoming key selector 552 is a 2-bit value, KSEL[1:0], to enable the one-of-four selection. More or fewer predetermined mask keys may be provided within the key table 609 in an alternative embodiment, and the number of bits of the key selector 552 correspondingly increased or decreased. In one embodiment, the key table 609 includes a bank of programmable storage circuits that are programmed with mask keys supplied by the memory controller during system initialization. The programmable storage circuits may be implemented using volatile or non-volatile storage elements and, in the case of non-volatile storage elements may be programmed during system production or in a configuration-setting operation. In an alternative embodiment, the key table 609 includes a hard-wired set of mask keys (e.g., achieved through dedicated circuit design or through one-time programmable operation such as a fuse-blowing programming operation).

Sub-Block Coding

As mentioned briefly above, one approach to reducing mask conflicts in a key-selecting memory controller is to select multiple mask keys for each incoming write data block, each selected mask key corresponding to a respective sub-block (i.e., portion) of the write data block. Each selected mask key is then substituted for mask values within the corresponding sub-block to generate a coded sub-block, and the coded sub-blocks are transmitted to the storage subsystem along with the corresponding sub-block key selectors. The reduced population size of each sub-block (i.e., reduced number of write data values as compared to the complete write data block), produces an approximately proportional reduction in the probability of a mask conflict.

FIG. 24 illustrates an exemplary spatial partitioning of a 64-byte write data block into two 32-byte sub-blocks, sub-block 0 and sub-block 1. As shown, the 32 data bytes transmitted on data lines DQ00 to DQ15 form sub-block 0, and the 32 data bytes transmitted on data lines DQ16–DQ31 form sub-block 2. Finer spatial partitioning may be used in alternative embodiments to further reduce the likelihood of mask conflicts (e.g., partitioning into 4 sub-blocks each transmitted on set of eight lines of the data path).

FIG. 25 illustrates an exemplary temporal partitioning of a 64-byte write data block into two 32-byte sub-blocks, sub-block 0 and sub-block 1. As shown, the 32 data bytes transmitted during transmission intervals 0–7 form sub-block 0, and the 32-data bytes transmitted during transmission intervals 8–15 form sub-block 1. Finer temporal partitioning may be used in alternative embodiments (e.g., partitioning into 4 sub-blocks each transmitted one after another during respective sets of transmission intervals). Also, combinations of temporal and spatial partitioning may also be used. For example, the spatial partition depicted in FIG. 24 may be combined with the temporal partition of FIG. 25 to produce a four-quadrant partition. Further, while serialized data transfer schemes are illustrated in FIGS. 24 and 25, parallel data transfer schemes (e.g., as shown in FIG. 12) may alternatively be used.

Regardless of the type and number of partitions, separate key selector values are generated based on the write data values within each of the sub-blocks, and used to select respective mask keys for coding the sub-blocks. The coded sub-blocks and corresponding key selectors are then output to the storage subsystem.

FIG. 26 illustrates an exemplary encoding of a key selector that may be used within a key-selecting memory system of the present invention. As shown, a 2-bit key selector, KSEL[1:0], is used to indicate whether a given write operation is a masked-write operation or an unmasked write operation, and if a masked-write operation, to specify one of three predetermined mask keys. That is, if the key selector specifies any one of the three predetermined mask keys, a masked-write operation is indicated. Otherwise the key selector is set to 00 to indicate an unmasked write operation.

Key Generator Having a Decoder and a Binary Propagation Tree

Figure 27:
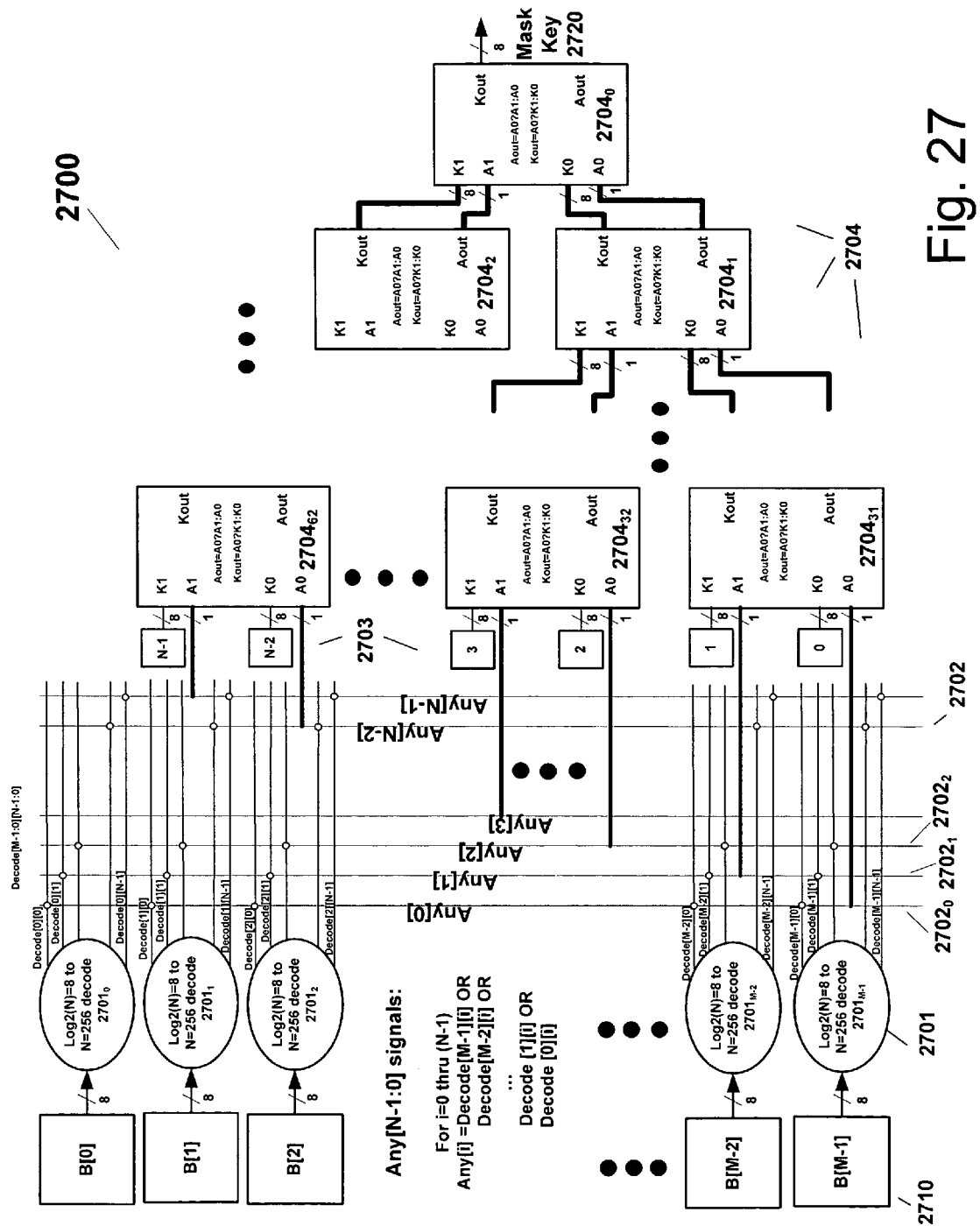
FIG. 27 illustrates a key generator including a decoder and a binary propagation tree embodiment of the invention.

FIG. 27 illustrates a key generator 2700 including a plurality of decoders and a binary propagation tree 2704 according to an embodiment of the present invention. Key generator 2700 is used instead of key generator 291 as shown in FIG. 6 in an embodiment of the present invention. Key generator 2700 is also used instead of key generator 350 including binary adders or summing circuits as shown in FIG. 9 in still another embodiment of the present invention.

Key generator 2700 has a number of advantages compared to key generators 291 and 350. First, key generator 2700 does not use pipelined carry-save binary adders that are compute intensive thereby enabling the write-mask key to be generated with a reduced latency. As key generator 350 is scaled upward, additional binary adders are required that may increase latency beyond a desired limit. Second, key generator 2700 uses less or approximately the same circuit area as key generator 350 in embodiments of the present invention. Third, key generator 2700 is less complicated and may be easier to implement, debug, or test. Fourth, standard hardware synthesis tools, such as Synopsys' Design Compiler can do a good job with the design's implementation. In contrast, more advances tools or custom library cells may be used to design and analyze key generator 291 and 350 in embodiments of the invention . . . This increased logical complexity may not yield a desired balance of chip area, latency and cycle time that may be provided using key generator 2700.

Table 1 below illustrates some of the above advantages of key generator 2700. Table 1 is a summary report from Synopsys' Design Compiler as used to synthesize the write-mask key generators at a particular cycle-time (CYC). The first three rows list the latency (in nanoseconds), circuit area (in squared micrometers) and approximate number of gates for key generator 350. The last two rows (a 32-byte and 64-byte embodiment of key generator 2700, respectively) list the latency, circuit area and approximate number of gates for key generator 2700. As can be seen, the circuit area (Area Total) used by key generators 350 and 2700 are approximately the same; yet the latency (or cycle time) of key generator 2700 is substantially reduced as compared to key generator 350 (2.2 ns versus 1.78 ns). Further, as the cycle-time target for synthesis is relaxed, the hardware synthesis tools should be able to achieve further area optimizations.

TABLE 1

| N (Bytes) | Lat (ns) | CYC | Area Comb | Area Non-Comb | Area Net | Area Total | Approx Gates | Approx Comb Gates |
|---|---|---|---|---|---|---|---|---|
| Adder/64 | 2.20 | 2.5 | 82207 | 74267 | 26035 | 182509 | 13036 | 5872 |
| Adder/64 | 2.19 | 2 | 84548 | 74169 | 26754 | 185471 | 13248 | 6039 |
| Adder/64 | 2.19 | 1.5 | 89162 | 74341 | 27668 | 191171 | 13655 | 6369 |
| 32 | 1.43 | | 38748 | 11696 | 10844 | 61288 | 4378 | 2768 |
| 64 | 1.78 | | 142831 | 23640 | 38002 | 204473 | 14605 | 10202 |

Returning to FIG. 27, key generator 2700 outputs a mask key responsive to the plurality of data values 2710. In an embodiment of the present invention, data values 2710 include subsets of the plurality of data values or write bytes B[0]-B[M−1] and the number of byte codes N equals 256, where M is less than or equal to N. Write bytes B[0]-B[N−1] are also referred to as write data values herein. In an embodiment of the invention, M write bytes B[0] to B[M−1] are transferred to memory controller 201, and in particular to key generator 291, as shown in FIGS. 4 and 6. M bytes B[0] to B[M−1] are also transferred to storage subsystem 203 by memory controller 201 in an embodiment of the invention.

As long as there is at least one repeated data value across write bytes B[0]-B[M−1] values being decoded, a valid mask key will be generated by the key generator 2700, and there will be a zero probability of a mask key conflict with any unmasked write byte. However, in the presence of fully unique write bytes B[0]-B[M−1], the potential exists for a mask key conflict. To eliminate the possibility of a mask key conflict with an unmasked write byte B[x], masked bytes should be substituted with an appropriate value prior to the decoding as described below. There are multiple ways for arriving at an appropriate value for this initial substitution. One way is to replace each masked write byte B[x] with its neighbor's value B[x−1].

Write bytes B[0] to B[M−1] are input to a plurality of respective decoders 2701. In an embodiment of the invention where N=256, decoder $2701_0$ is a $Log_2(N)$ decoder that outputs 256 decoded values on respective lines (Decode [M−1:0][N−1:0]) to OR logic gate tree 2702 responsive to an 8 bit value of byte B[0]. Likewise, decoder $2701_1$, as well as the other decoders, is a $Log_2(N)$ decoder that outputs 256 decoded values on respective lines to OR logic gate tree 2702 responsive to an 8 bit value of write byte B[1].

A plurality of first respective outputs of decoders 2701 are input to an OR logic gate $2702_0$, in OR logic gate tree 2702, that outputs a value to node $2704_0$, in particular an A0 input, in binary propagation tree 2704. Accordingly, when any of the first outputs of decoders 2701 are a logic 1 (Any[i]), OR logic gate $2702_0$ then outputs a logic 1 to node $2704_0$. Likewise, a plurality of second respective outputs of decoders 2701 are input to an OR logic gate $2702_1$, in OR logic gate tree 2702, that outputs a value to node $2704_0$, in particular an A1 input, in binary propagation tree 2704. The remaining respective outputs of decoders 2701 are input to respective OR logic gates, in OR logic gate tree 2702, that output respective values to a first level of respective nodes, in particular respective A0 and A1 inputs, in binary propagation tree 2704.

Binary propagation tree 2704 includes a plurality of nodes in which a first set of nodes (or first rank) is coupled to OR logic gate tree 2702 and a last node (or sixth rank) output a mask key 2720. In an embodiment of the present invention, there will be 6 ranks of nodes: a first rank including 32 nodes ($2704_{31}$ though $2704_{62}$); a second rank including 16 nodes; a third rank including 8 nodes; a fourth rank including 4 nodes; a fifth rank including 2 nodes ($2704_1$ and $2704_2$); and a sixth rank including 1 node ($2704_0$). In an embodiment of the invention, each node includes four inputs, A0, A1, K0 and K1 and two outputs, Aout and Kout. A first set of nodes is coupled to OR logic tree 2702 by inputs A0 and A1 and also coupled to constant values 2703 by inputs K0 and K1. For example, constant values "0" and "1" are provided to inputs K0 and K1, respectively, of node $2704_{31}$. Similarly, constant values "2" and "3" are provided to inputs K0 and K1, respectively, of node $2704_{32}$. Other nodes in the first set of nodes in binary propagation tree 2704 have similar sequential constant values provided to inputs K0 and K1.

In an alternate embodiment of the present invention, an OR logic gate tree 2702 or active-high wire OR logic is replaced with active low-wire AND logic. In this embodiment of the present invention, the polarity of the decoders 2701 outputs and multiplexer select inputs (A0 and A1) would be inverted in comparison with an OR logic embodiment. An AND logic embodiment may provide faster signal propagation times and a small surface area.

In one embodiment, constant values 2703 include a bank of programmable storage circuits that are programmed with constant values supplied by a memory controller during system initialization. The programmable storage circuits may be implemented using volatile or non-volatile storage elements and, in the case of non-volatile storage elements may be programmed during system production or in a configuration-setting operation. In an alternative embodiment, constant values 2703 includes a hard-wired set of constant values (e.g., achieved through dedicated circuit design or through one-time programmable operation such as a fuse-blowing programming operation In a preferred embodiment of the present invention, constant values are set using a Verilog synthesis tool to perform Boolean optimizations and yield an implementation with better reductions in surface area and latency.

A first set of nodes in binary propagation tree 2704 provides inputs to a second set of nodes at a second level of binary propagation tree 2704. The outputs of each set of nodes are provided to inputs of a next set of nodes until a last node outputs mask key 2720 at output Kout. For example, outputs Aout and Kout of node $2704_1$ are coupled to inputs A0 and K0 of node $2704_0$, respectively, and outputs Aout and Kout of node $2704_2$ are coupled to inputs A1 and K1 of node $2704_0$, respectively.

Figure 28:
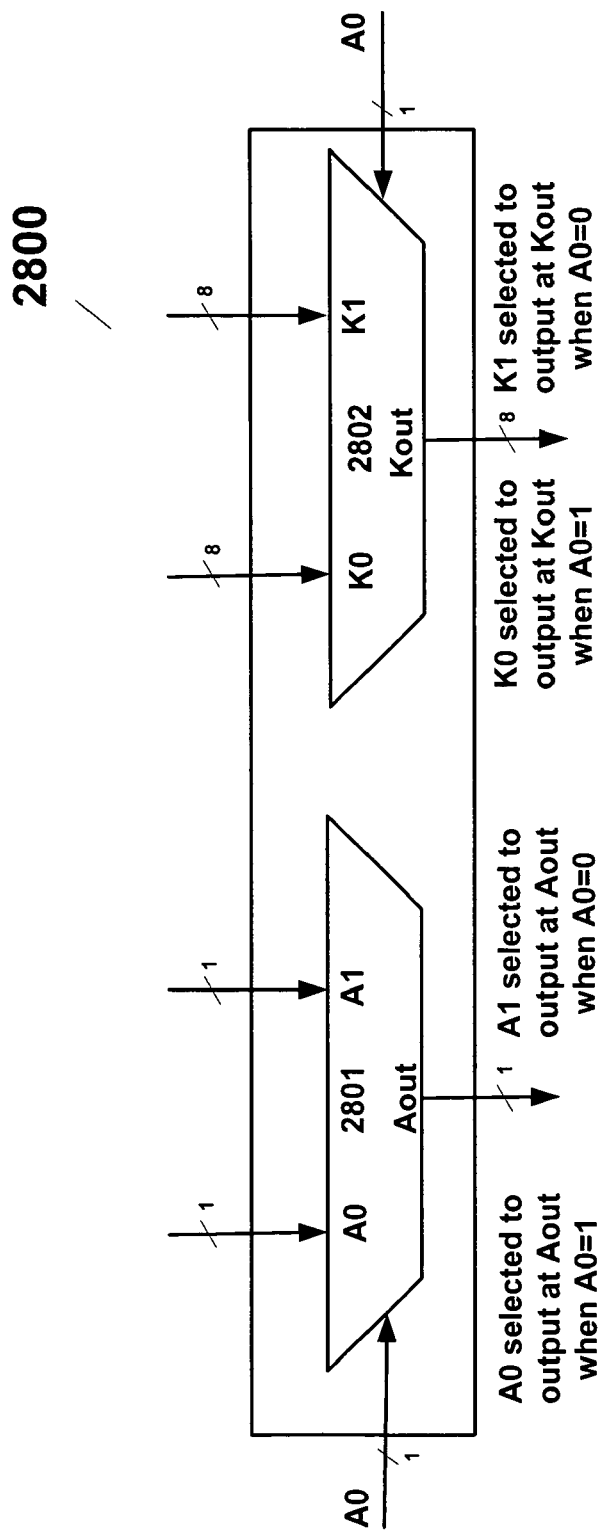
FIG. 28 illustrates a node of a binary propagation tree shown in FIG. 27 according to an embodiment of the invention.

FIG. 28 illustrates a node 2800 of a binary propagation tree 2704 shown in FIG. 27. In an embodiment of the present invention, node 2800 is used as node $2704_1$ of binary propagation tree 2704. In alternate embodiments of the invention, node 2800 is used as some or all of the nodes of binary propagation tree 2704.

Node 2800 includes two input multiplexers 2801 and 2802. Multiplexer 2801 output a value at output Aout from two inputs A0 and A1 responsive to a select signal. In an embodiment of the invention, the select signal is the same signal as provided to input A0. Multiplexer 2802 output a value at output Kout from two inputs K0 and K1 responsive to the same select signal. In embodiments of the present invention, the select signals are the same signals input to inputs A0 and A1 of multiplexer 2801. In an alternate embodiment of the present invention, in order to balance the loading of select signals a combination of select signals to inputs A0 and A1 can be used for selecting an output as long as logic correctness is maintained.

In yet another embodiment of the present invention, an AND gate may be used in replace of multiplexer 2801.

Figure 29:
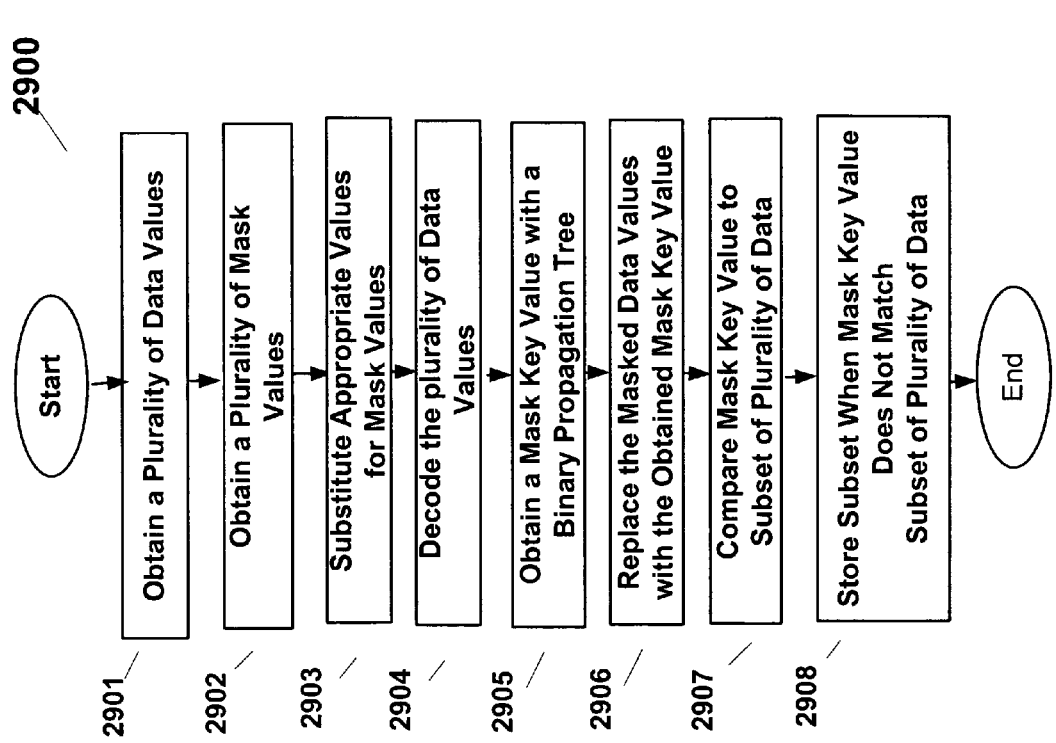
FIG. 29 illustrates a method for providing a mask key according to an embodiment of the invention.

FIG. 29 illustrates a method 2900 for calculating a mask key according to an embodiment of the invention. Steps, operations or logic illustrated in FIG. 29 are carried out by hardware, software (i.e. executable machine readable instructions), a user or a combination thereof, in embodiments of the invention. The steps illustrated in FIG. 29 are carried out by the circuit components illustrated in FIGS. 4, 6, 27 and 28 in alternate embodiments of the present invention. As one of ordinary skill in the art would appreciate, other steps that are not shown may be included or shown steps may be excluded in various embodiments of the present invention.

Method 2900 begins at step 2901 where a plurality of data values is obtained. In an embodiment of the invention, memory controller 201 as illustrated by FIG. 4 obtains the plurality of data values.

At step 2902 a plurality of mask values is obtained. In an embodiment of the present invention, the plurality of mask values is obtained from host interface 205 in memory controller 201 shown in FIG. 4.

At step 2903 appropriate values are substituted for particular mask data values in an embodiment of the invention.

A mask key is then calculated or generated as represented by steps 2904 and 2905. At step 2904, the plurality of data values are decoded. In an embodiment of the invention, decoders 2701, as shown in FIG. 27, decode the plurality of data values. In particular, a decoder decodes a subset of the plurality of data values or decodes a byte in the plurality of data values. At step 2905, the plurality of data values that have been decoded are then input to a binary propagation tree, such as binary propagation tree 2704 shown in FIG. 27. A mask key is then obtained and transferred from a memory controller to a memory device as seen in FIG. 4 in an embodiment of the invention.

At step 2906, mask data values are replaced with an obtained mask key.

At step 2907, the mask key is compared to a subset of the plurality of data values or write data value. For example, compare circuit 241 compares a mask key to an incoming write data value or a subset of the plurality of data values as shown in FIG. 4.

A subset of the plurality of data values is then stored as illustrated by step 2908. In an embodiment of the invention, a subset of the plurality of data values (i.e. byte) is stored in storage array 245 of memory device $221_0$ by read/write circuit 243.

Method 2900 then Ends.

Section headings have been provided in this detailed description for convenience of reference only, and in no way define, limit, construe or describe the scope or extent of such sections. The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A memory controller, comprising:
   a host interface to receive a plurality of write data values and a plurality of mask values, wherein a mask value in the plurality of mask values is capable of indicating whether a corresponding one of the plurality of write data values is to be excluded from a storage array within a memory device;
   a mask logic circuit, coupled to the host interface, to generate a mask key responsive to the plurality of write data values and the plurality of mask values, wherein the mask logic circuit includes a binary propagation tree; and
   a memory interface, coupled to the mask logic circuit, to output the plurality of write date values and the mask key to the memory device.

2. The memory controller of claim 1, wherein the mask logic circuit includes:
   a plurality of OR logic gates coupled to a plurality of decoders to decode the plurality of write data values.

3. The memory controller of claim 1, wherein the mask logic circuit includes:
   a plurality of $\log_2$ decoders coupled to the binary propagation tree.

4. The memory controller of claim 1, wherein the mask logic circuit includes:
   a decoder coupled to the binary propagation tree that outputs the mask key.

5. The memory controller of claim 4, wherein the mask logic circuit further includes:
   an OR logic gate coupled to the decoder and the binary propagation tree.

6. The memory controller of claim 5, wherein the binary propagation tree includes a node having a first multiplexer and a second multiplexer, wherein the first multiplexer is coupled to the OR logic gate.

7. The memory controller of claim 1, wherein the mask logic circuit includes:
   a first decoder, coupled to the binary propagation tree, to decode a first subset of the plurality of write data values, and
   a second decoder, coupled to the binary propagation tree, to decode a second subset of the plurality of write data values.

8. The memory controller of claim 7, wherein the first subset and the second subset are a first byte of data and a second byte of data, respectively.

9. The memory controller of claim 7, wherein the mask logic circuit further includes:
   a first OR logic gate coupled to the first and second decoders and the binary propagation tree.

10. The memory controller of claim 9, wherein the binary propagation tree includes a node having a first multiplexer and a second multiplexer, wherein the first multiplexer is coupled to the OR logic gate.

11. An apparatus, comprising:
    a master device including
        a mask logic circuit to generate a mask key responsive to a plurality of data values and a plurality of mask values, wherein the mask logic circuit includes a binary propagation tree; and
    a memory device, coupled to the master device, to receive the mask key and the plurality of data values and to store the plurality of data values responsive to a comparison with the mask key.

12. The apparatus of claim 11, wherein the mask logic circuit includes:
    a decoder coupled to the binary propagation tree that outputs the mask key.

13. The apparatus of claim 12, wherein the mask logic circuit further includes:
    an OR logic gate coupled to the decoder and the binary propagation tree.

14. The apparatus of claim 13, wherein the binary propagation tree includes a node having a first multiplexer and a second multiplexer, wherein the first multiplexer is coupled to the OR logic gate.

15. The apparatus of claim 11, wherein the mask logic circuit includes:
    a plurality of $\log_2$ decoders coupled to the binary propagation tree.

16. The apparatus of claim 11, wherein the mask logic circuit includes:
    a first decoder, coupled to the binary propagation tree, to decode a first subset of the plurality of data values, and
    a second decoder, coupled to the binary propagation tree, to decode a second subset of the plurality of data values.

17. The apparatus of claim 16, wherein the first subset and the second subset are a first byte of data and a second byte of data, respectively.

18. A circuit, comprising:
    a plurality of decoders to decode a plurality of data values, wherein the plurality of decoders decode respective subsets of the plurality of data values;
    a plurality of OR logic gates coupled to the plurality of decoders;
    a binary propagation tree, coupled to the plurality of OR logic gates, to output a mask key that is different than any of the respective subsets of the plurality of data values.

19. The circuit of claim 18, wherein the plurality of decoders are a plurality of $\log_2$ decoders.

20. The circuit of claim 18, wherein the respective subsets are bytes of data.

21. The circuit of claim 18, wherein the binary propagation tree includes a first node having a first multiplexer and a second multiplexer, wherein the first multiplexer is coupled to a first OR logic gate in the plurality of OR logic gates, wherein the first OR logic gate is coupled to a first decoder in the plurality of decoders.

22. The circuit of claim 18, wherein the mask key is transferred to a memory device and used to selectively store the plurality of data values in a storage array.

23. A method, comprising:
    obtaining a plurality of data values;
    obtaining a plurality of mask values corresponding to the plurality of data values; and
    calculating a mask key from a plurality of subset values of the plurality of data values and the plurality of mask values, wherein the mask key does not match each subset in the plurality of subset values.

24. The method of claim 23, wherein the plurality of subset values are a plurality of bytes.

25. The method of claim 23, further comprising:
    using the mask key in encryption.

26. The method of claim 23, further comprising:
    using the mask key in decryption.

27. The method of claim 23, further comprising:
transferring the mask key to a memory device, and
transferring the plurality of data values to the memory device.

28. The method of claim 27, wherein the mask key identifies which data values in the plurality of data values are to be stored in a storage array of the memory device.

29. The method of claim 27, further comprising:
comparing the mask key to a subset value in the plurality of subset values; and
storing the subset value in a storage array in the memory device when the mask key value does not match the subset value.

30. The method of claim 23, wherein the calculating comprises:
decoding the plurality of subset values, and
obtaining a mask key value by using a binary propagation tree.

31. The method of claim 30, wherein the binary propagation tree includes a node having a first and second multiplexer.

32. An apparatus, comprising:
a receiver capable to receive a plurality of data values and a plurality of mask values; and,
means, coupled to the receiver, for providing a mask key responsive to the plurality of data values and the plurality of mask values, wherein the mask key identifies which data values in the plurality of data values are stored in a storage array in a memory device.

* * * * *